United States Patent
Cheng et al.

(10) Patent No.: US 10,482,986 B2
(45) Date of Patent: Nov. 19, 2019

(54) ADAPTIVE ERASE FAIL BIT CRITERIA

(71) Applicant: Western Digital Technologies, Inc., San Jose, CA (US)

(72) Inventors: Chao-Han Cheng, San Jose, CA (US); Nian Niles Yang, Mountain View, CA (US); Anubhav Khandelwal, San Jose, CA (US); Chung-Yao Pai, Sunnyvale, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 283 days.

(21) Appl. No.: 15/793,092

(22) Filed: Oct. 25, 2017

(65) Prior Publication Data

US 2019/0122741 A1  Apr. 25, 2019

(51) Int. Cl.
*G11C 16/34* (2006.01)
*G11C 11/56* (2006.01)
*G11C 16/14* (2006.01)
*G11C 16/04* (2006.01)

(52) U.S. Cl.
CPC .......... *G11C 16/3495* (2013.01); *G11C 11/56* (2013.01); *G11C 16/14* (2013.01); *G11C 16/0483* (2013.01)

(58) Field of Classification Search
CPC .......................... G06F 12/0246; G11C 11/56
See application file for complete search history.

(56) References Cited

U.S. PATENT DOCUMENTS

| 6,222,772 | B1 | 4/2001 | Choi et al. |
| 9,001,589 | B2* | 4/2015 | Baek ............... G11C 11/5635 365/185.22 |
| 9,378,809 | B1* | 6/2016 | Srinivasan ............ G11C 7/00 |
| 2014/0043914 | A1* | 2/2014 | Shim .................. G11C 16/14 365/185.22 |

* cited by examiner

*Primary Examiner* — Prasith Thammavong
*Assistant Examiner* — Edmund H Kwong
(74) *Attorney, Agent, or Firm* — Vierra Magen Marcus LLP

(57) ABSTRACT

Adaptively changing a fail bit count for an erase operation is disclosed. A memory system may detect an erase stuck bit condition in a group of memory cells. An erase stuck bit condition refers to a situation in which the threshold voltage of at least one memory cell on string tends to stick, such that the string cannot be erased. The memory system performs an action in response to detecting an erase stuck bit condition, in one embodiment. One possible action is to increase a fail bit count for erase operations for other groups of memory cells, which could also potentially suffer from erase bit stuck conditions. This can help reduce erase stress on groups of memory cells. It can also reduce the number of groups of memory cells that need to be retired for failing an erase operation.

20 Claims, 15 Drawing Sheets

First programming pass

Second programming pass

ADAPTIVE ERASE FAIL BIT CRITERIA

BACKGROUND

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory).

An erase operation of non-volatile memory cells, such as NAND cells, may involve applying erase conditions, which are intended to lower the threshold voltage of the memory cells. The actual erase conditions may vary depending on the architecture and erase technique. After applying the erase conditions, an erase verify may be performed to determine whether a sufficient number of the memory cells have had their threshold voltage lowered to an erase verify reference voltage. Typically, it is not required for all memory cells in the group to have their threshold voltage drop below the erase verify reference voltage, with the error procedure overall still passing. The erase conditions may be applied again if more than a permitted number of memory cells have a threshold voltage above the erase verify reference voltage. This may be followed by another erase verify.

Herein, this failure of a memory cell or string of memory cells to pass an erase criterion is referred to as an "erase fail bit" or more simply "fail bit." Despite having at least one fail bit at the end of the erase operation, data can still be programmed into the group. Moreover, the data can be read back successfully by use of an error correction algorithm.

BRIEF DESCRIPTION OF THE DRAWINGS

Like-numbered elements refer to common components in the different figures.

DETAILED DESCRIPTION

Non-volatile storage systems and methods of operating non-volatile storage systems are disclosed. Embodiments disclosed herein adaptively change a fail bit count for an erase operation. The term "fail bit," as used herein, refers to a failure of some unit of memory cells to pass a verify reference level. The unit may be a NAND string. For example, during an erase operation, NAND strings may be verified with respect to an erase verify reference voltage. A count of the number of NAND strings that have failed to be erased with respect to the erase verify reference voltage is one example of a fail bit count.

In one embodiment, a memory system is able to detect an erase stuck bit condition in a group of memory cells. An erase stuck bit condition refers to a situation in which the threshold voltage of at least one memory cell on a string tends to stick, such that the string cannot be erased. The memory system is able to distinguish between the erase stuck bit condition and other problems, in one embodiment. The memory system performs an action in response to detecting an erase stuck bit condition, in one embodiment. One possible action is to increase a fail bit count for erase operations for other groups of memory cells, which could also potentially suffer from erase bit stuck conditions. This can help reduce erase stress on groups of memory cells. It can also reduce the number of groups of memory cells that need to be retired for failing an erase operation. Another possible action is to increase a fail bit count for the group for which the erase stuck bit condition was detected. Another possible action is to alter the manner in which data is folded from single bit per cell storage to multi-bit per cell storage.

Figure 1:
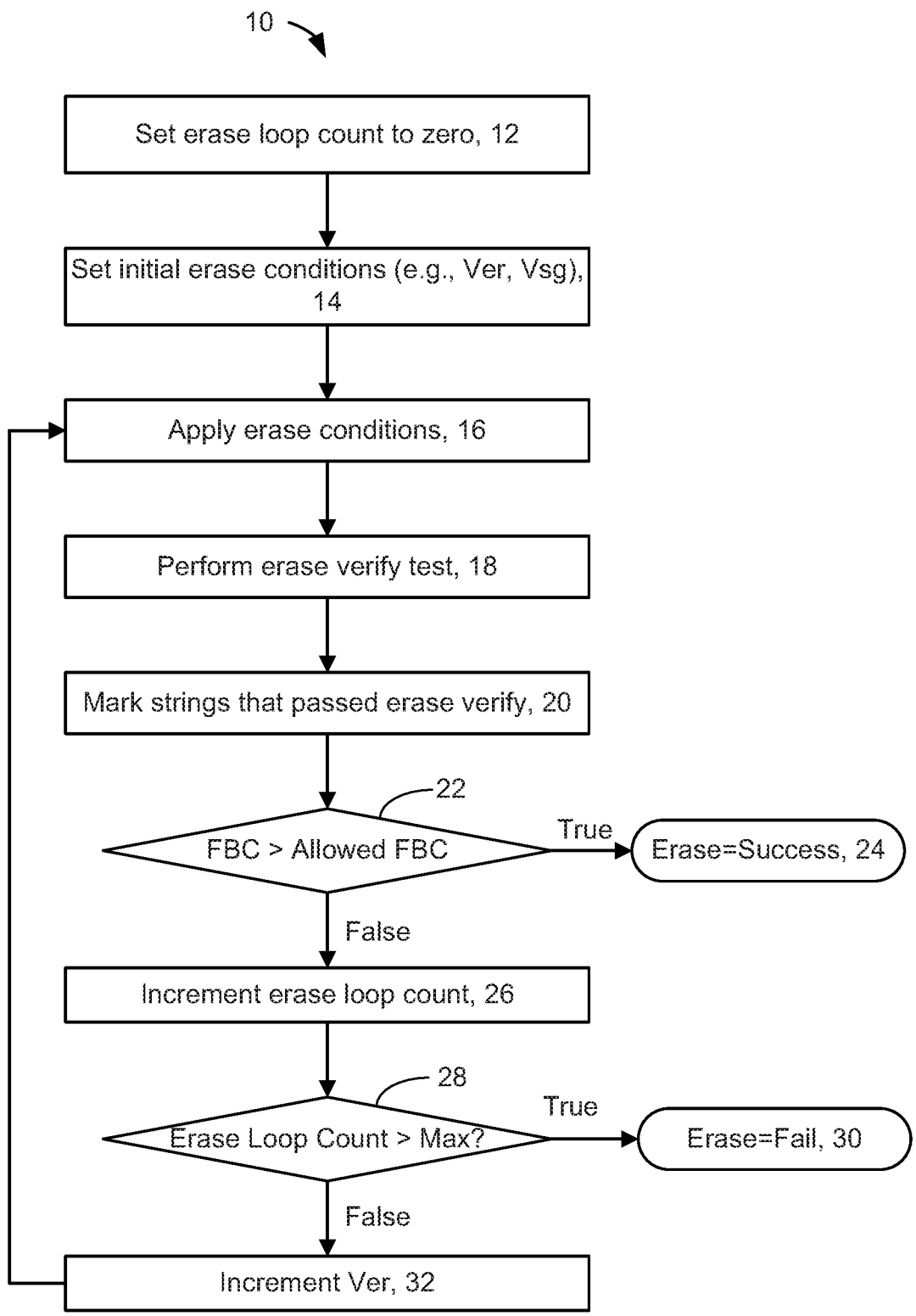
FIG. 1 depicts one embodiment of a process for performing an erase operation.

FIG. 1 depicts one embodiment of a process 10 for performing an erase operation. The process 10 can be performed in a memory device 100 such as, but not limited to, the embodiments of memory devices disclosed herein. The process can be used to erase a group of memory cells that presently have a distribution such as, but not limited to, the examples of FIGS. 5, 6, and 8A. The process 10 is applied to a group of memory cells. In one embodiment, the group is a block of memory cells. In one embodiment, the group includes a set of NAND strings. The NAND strings are in a three-dimensional memory structure, in one embodiment. The NAND strings may include a select gate on at least one end of the string. For example, the select gate may be a drain side select gate, which has one of its terminals (e.g., drain) coupled to a bit line. As another example, the select gate may be a source side select gate, which has one of its terminals coupled to a source line.

Step 12 is to initialize an erase loop count to zero. The erase loop count will be tracked in process 10 in order to limit the number of erase loops. Note that limiting the erase loop count can reduce stress on the memory cells, as well as associated elements such as select gate transistors.

Step 14 sets initial erase conditions. The erase conditions include a magnitude of an erase voltage (Ver), in one embodiment. The erase conditions may include other parameters, such as a magnitude of a select gate voltage. In one embodiment, process 10 performs a single sided erase on the bit line side. Thus, the initial erase voltage is for a bit line voltage, in one embodiment. In one embodiment, process 10 performs a single sided erase on the source line side. Thus, the initial erase voltage is for a source line voltage, in one embodiment. In one embodiment, process 10 performs a two-sided erase on the source line side and the bit line side. Thus, step 12 may include setting a magnitude of an initial erase voltage for the bit line and magnitude of an initial erase voltage for the source line. In one embodiment, the erase voltage has the same magnitude on the bit line and the source line.

Step 16 includes applying erase conditions. Step 14 may include applying suitable voltages to a bit line, a source line, control gate(s) of drain side select transistor(s), control gate(s) of source side select transistor(s), and control gates of memory cells. Details of example memory devices having source lines, bits lines, select transistors, word lines, control gates, and NAND strings are discussed below.

Step 16 may include charging up (e.g., increasing the voltage of) a channel of the memory string from the source and/or the drain end, and setting a low voltage such as 0 V on the word lines (control gates) of the memory cells. In one embodiment, charging up the channels includes applying a suitable voltage to the drain side and/or the source side select gates to generate GIDL current.

Figure 5:
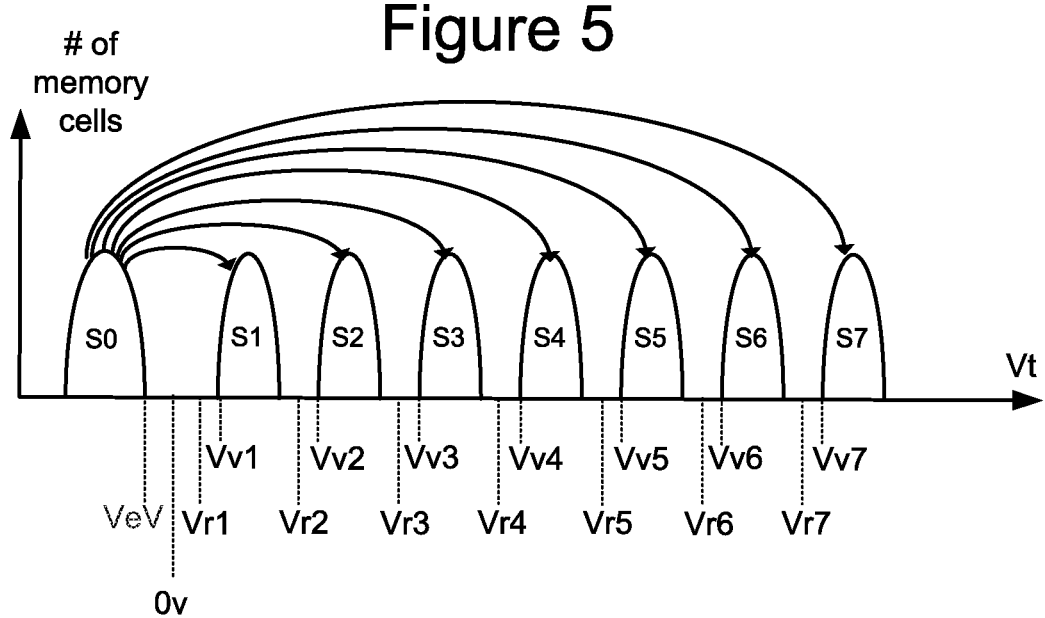
FIG. 5 illustrates example threshold voltage distributions for the memory cell array when each memory cell stores three bits of data.
Figure 8A:
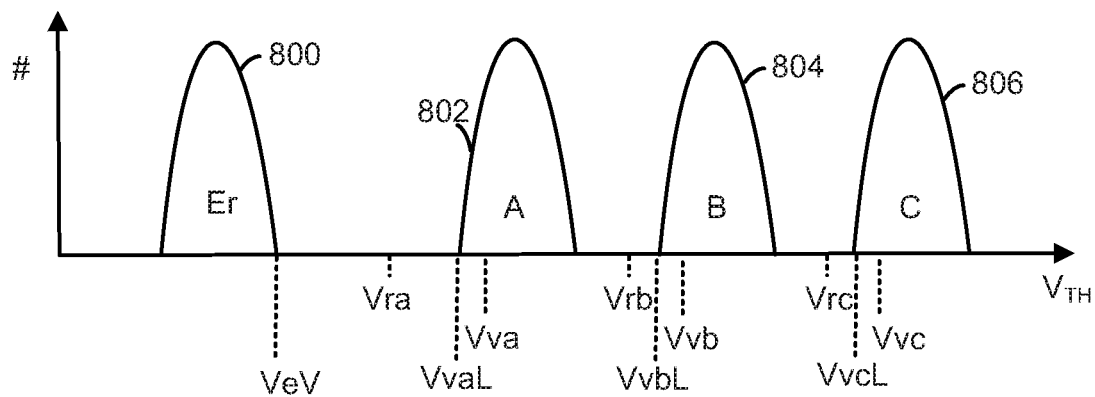
FIG. 8A depicts one embodiment of a set of threshold voltage distributions for a four-state memory device in which each storage element stores two bits of data.

Step 18 includes performing an erase verify test. This erase verify test is performed on a NAND string basis, in one embodiment. Typically, this involves setting an erase verify voltage VeV to the word lines that are connected to control gates of memory cells on the strings while sensing a current in the respective NAND strings. FIGS. 5, 6, and 8A show examples of VeV at the upper end the respective erase distributions. If the current is sufficiently high, the NAND string is considered to pass the verify test. Note that this erase verify test effectively determines whether there is at least one memory cell on a NAND string having a threshold voltage above VeV. Herein, the phrase, "NAND string threshold voltage" or the like is used as shorthand for, "the highest memory cell threshold voltage of any memory cell on a NAND string."

Step 20 may include marking the NAND strings the passed erase verify. In one embodiment, the status of such NAND strings is set to indicate that the NAND string should no longer receive erase voltages. In a further iteration of step 14, the erase voltage is not applied to a bit line connected to a NAND string that has already passed erase, in one embodiment.

Step 22 is a test to determine whether erase passed for the group. This test determines whether erase passes with respect to the erase verify voltage used in step 18. The test compares a fail bit count (FBC) with an allowed FBC. It is not required that every memory cell be erased for the test to pass. For example, is not required that every memory cell to have its threshold voltage lowered below the erase verify reference voltage. In one embodiment, providing that less than a certain number of NAND strings fail erase, the group of NAND strings overall passes erase in step 24. The number of NAND strings allowed to have a threshold voltage above the erase reference voltage (VeV) is an example of an FBC.

If the erase for the group has not yet passed (e.g., if the FBC is greater than the allowed FBC), then the erase loop count in incremented in step 26. Step 28 is a determination of whether the erase loop count is greater than a maximum allowed count. If so, then the erase process status is set to Erase=Fail in step 30. Some embodiments disclosed herein perform additional tests on the group of memory cells in the event the erase has failed. In some cases, the group memory cells can still be used even if the erase process has failed. This avoids the retiring the group due to the erase process 10 failing. If too many groups of memory cells are retired as a result of the erase process failing, the system may run out of free memory cells. Thus, embodiments disclosed herein can reduce or eliminate running out of memory. Note that process 1000 in FIG. 10 may be performed in response to the erase status of fail in step 30.

If the erase loop count is not greater than the allowed maximum (step 28=False), then the magnitude of the erase voltage is incremented in step 32. Other erase conditions may also be changed in step 32. When step 16 is performed again, the erase voltage is only applied to bit lines of NAND strings that have not yet passed erase, in one embodiment.

Figure 1A:
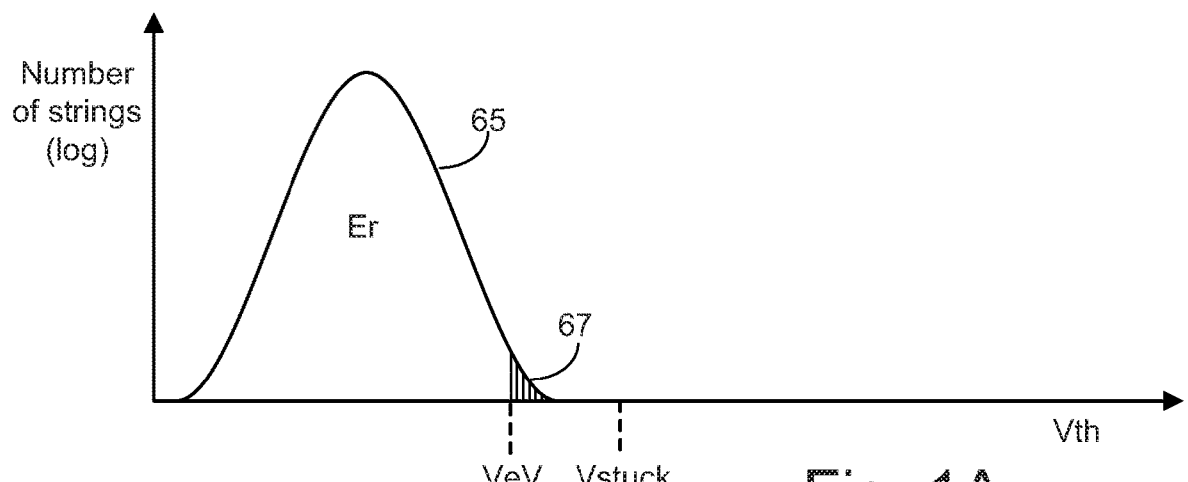
FIG. 1A depicts one possible erase distribution after a successful erase operation of a group of memory cells.

FIG. 1A depicts one possible erase distribution 65 after a successful erase operation of a group of memory cells. More particularly, the erase distribution 65 is for a group of NAND strings. The group could be a block of memory cells. Erase distribution 65 may result in the event process 10 ends with Erase=success in step 24. The vertical axis is for the number of NAND strings of memory cells. The horizontal axis represents the highest threshold voltage of any memory cell on the NAND string. NAND strings for which the highest memory cells threshold voltage is at or below VeV were successfully erased. The erase distribution 65 shows that a few NAND strings have at least one memory cell having a Vth above VeV.

The erase distribution 65 has a roughly normal distribution, with no outliers in the example of FIG. 1A. Although the erase distribution 65 is depicted as symmetric, the erase distribution 65 may be skewed. The upper erase tail is defined herein as a region of the upper portion of a normal distribution (which may be symmetric or skewed). FIG. 1A shows an upper erase tail as being the portion of the erase distribution 65 that is above VeV. In the event that erase passes, then the FBC in the portion of the distribution 65 above VeV must be at or below the allowed FBC.

A second erase verify level "Vstuck" is also depicted for purpose of comparison. However, note that there are no erase stuck bits in the example of FIG. 1A. The second erase verify level is a higher magnitude reference voltage than the reference voltage of VeV. Hence, Vstuck is less stringent than VeV for determining whether NAND strings pass an erase operation. In one embodiment, Vstuck has a voltage magnitude that exceeds the threshold voltage of all bits in distribution 65, assuming distribution 65 is a normal distribution that passes erase with respect to VeV. In other words, Vstuck is above the upper tail 67 of distribution 65, in such an embodiment. Vstuck will be discussed more thoroughly in the example of FIG. 1B.

Note that FIG. 1A is described in terms of NAND strings, as this is consistent with the erase process 10 of FIG. 1 in which the NAND strings were verified. However, note that the concepts being discussed with respect to NAND strings can be applied to individual memory cells. For example, an erase distribution may be described based on threshold voltages of individual memory cells.

Even after performing a maximum allowed number of erase loops in an erase process such as, but not limited to, process 10, there may be too many NAND strings that have not yet passed erase. One possible reason for this failure is referred to herein as an "erase stuck bit" condition. An erase stuck bit condition refers to a condition in which it is unusually difficult to lower the threshold voltage of a string of memory cells (e.g., NAND string) using an erase operation. One possible cause of an erase stuck bit is due to an increase of the threshold voltage of a select gate transistor of the NAND string. Such an increase may be due to the erase conditions applied during an erase operation. Thus, the number of erase stuck bits may increase with program/erase cycles.

Figure 1B:
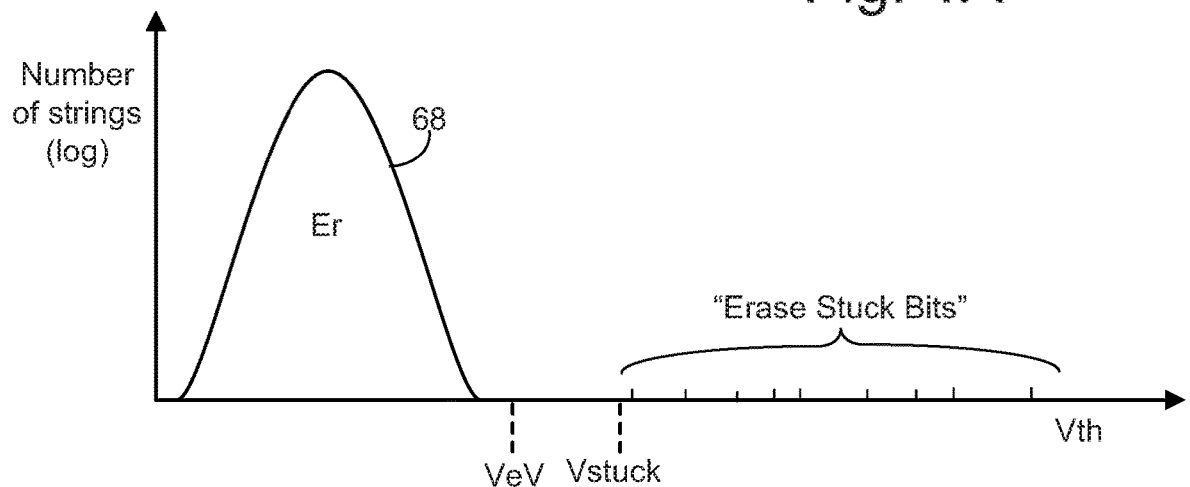
FIG. 1B depicts one possible result after an erase operation, in which there are a number of "erase stuck bits."

FIG. 1B depicts one possible result after an erase operation, in which there are a number of "erase stuck bits." As defined herein, the erase stuck bits are not part of the erase distribution 68. Note that the erase distribution 68 in FIG. 1B has a normal distribution (which may be symmetric or skewed). Hence, the erase stuck bits are not considered to be part of the normal distribution. The erase stuck bits have a threshold voltage above Vstuck. Note that Vstuck is to the right of VeV. This is so that fail bits that are just above VeV are not counted as erase stuck bits. A suitable magnitude for Vstuck may be determined based on how far to the right the upper tail 67 of an erase distribution that passes erase is expected to extend. For example, with reference to FIG. 1A, it is expected that the upper tail 67 can extend somewhat above VeV and for the upper tail 67 to contain less than (or equal to) the allowed number of fail bits. Note that the allowed number of fail bits are less than or equal to the number that can be corrected by an ECC engine in the memory device, in one embodiment. For example, Vstuck has a high enough magnitude to exclude all fail bits in the upper tail 67 in FIG. 1A, in one embodiment. In one embodiment, Vstuck is between 0.5V to 1V greater than VeV (which may be between 0V and 1.2V, for example).

It is evident that if there are too many erase stuck bits, then an erase procedure may fail. Moreover, an erase procedure such as erase process 10 may fail regardless of how many erase loops are performed. Consider an example in which erase process 10 allows 8 fail bits. If there are more than 8 erase stuck bits for the group, then the group cannot pass erase even if the maximum loop count were to be increased. Further note that each iteration of the erase process applies the erase voltage and erase verify voltage again, thus adding stress to the group. Hence, increasing the maximum erase loop count can increase stress on the memory cells.

Also note that if one group of memory cells has an erase stuck bit condition, then others groups may also suffer from an erase stuck bit condition. For example, if one block of memory cells has nine erase stuck bits, then another block may have 6, 7, 8, 9, or 10 erase stuck bits. Consider an example of another block having eight erase stuck bits and having an allowed fail bit count of eight in process 10. This block could potentially pass the erase process 10, but it may require a high number of erase loops due to the slim margin of requiring that all non-stuck bits pass erase verify. Using such a high number of erase loops can place substantial stress on the memory cells.

In one embodiment, a memory system is able to identify erase stuck bit situations. Moreover the memory system may take some action in response to the erase stuck bit situation. In one embodiment, the memory system dynamically changes a fail bit parameter in response to detecting an erase stuck bit situation. The fail bit parameter is a count of NAND strings in a group that are allowed to have a threshold voltage above an erase verify reference voltage, with the erase of the group still passing, in one embodiment. As noted, if one group of NAND strings suffers from an erase stuck bit problem other groups of NAND strings may be about to suffer the same problem. The memory system increases the allowed fail bit count, in one embodiment, which may allow other groups of NAND strings having an erase stuck bit problem pass an erase procedure. This can help reduce stress on NAND strings. It can also reduce the number of blocks that need to be retired.

Note that using a higher fail bit count in the erase process may lead to an erase distribution 65 having more bits above VeV. This could potentially lead to other issues such as an error correction algorithm taking longer to converge. Hence, using too high of a fail bit count may have drawbacks. Thus, using a higher fail bit count when there is not an erase stuck bit condition may harm performance without providing a benefit such as reduced stress on the memory cells.

In one embodiment, a memory system is able to identify erase stuck bit situations and increase the fail bit count for the group that failed the erase operation with a lower fail bit count. Then, the group may be erased again with the higher fail bit count, which may salvage a group that might otherwise need to be retired.

Figure 1C:
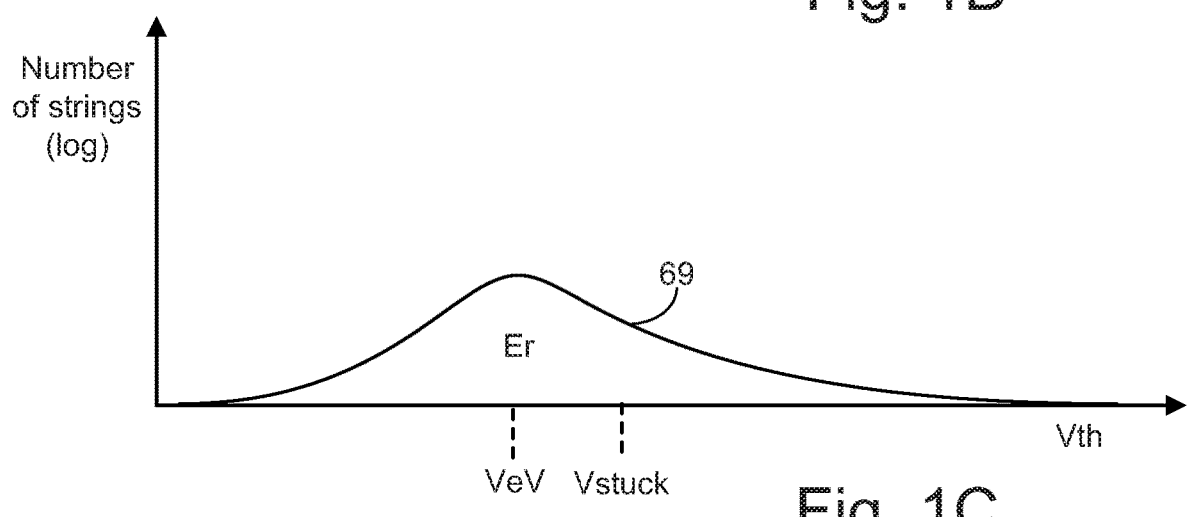
FIG. 1C depicts one possible distribution result after a failed erase operation.

Note that an erase operation may fail for a reason other than erase stuck bits. FIG. 1C depicts one possible distribution 69 result after a failed erase operation. The distribution 69 is based on the NAND string threshold voltage. This distribution 69 may result when process 10 ends with Erase-Fail in step 30. For example, even after an allowed number of erase loops, there are not enough NAND strings that passed erase verify with respect to the erase verify level used in step 18. Note that in distribution 69 there are many NAND strings that failed erase verify. One possible cause for this might be a word line to memory hole short. Thus, note that it is possible that one word line of memory cells are un-usable, but memory cells on other word lines in the group are still usable. Embodiments disclosed herein are able to distinguish between an erase stuck bit condition such as in FIG. 1B and a case such as distribution 69. In the event that a situation such as in FIG. 1B is detected, the memory system may take an appropriate action for that situation.

Note that the NAND strings with a threshold voltage above Vstuck are considered to be part of distribution 69. This is because those NAND strings are not defined herein as outliers. Also note that having so many fail bits may make it impossible to error correct data. Thus, a difference between the case in FIG. 1C and FIG. 1B is that the number of erase stuck bits in FIG. 1B is less than the number of bits that can be corrected using an ECC algorithm employed by the memory device. However, the number of bits having a greater threshold voltage than Vstuck in FIG. 1C is greater than the number than can be corrected using an ECC algorithm employed by the memory device.

Figure 2A:
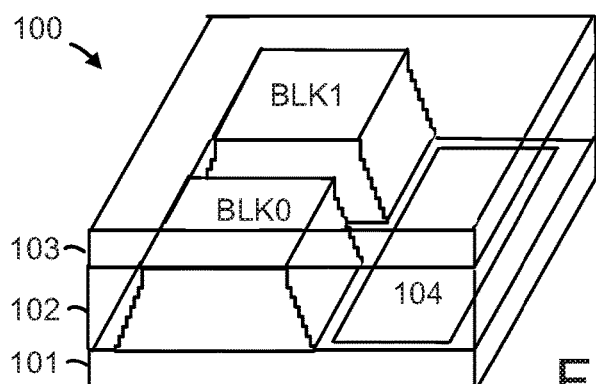
FIG. 2A is a perspective view of a 3D stacked non-volatile memory device.

FIGS. 2A-4 describe one example of a memory system that can be used to implement the technology proposed herein. FIG. 2A is a perspective view of a three dimensional (3D) stacked non-volatile memory device. The memory device 100 includes a substrate 101. On and above the substrate are example blocks BLK0 and BLK1 of memory cells (non-volatile storage elements). Also on substrate 101 is peripheral area 104 with support circuits for use by the blocks. Substrate 101 can also carry circuits under the blocks, along with one or more lower metal layers which are patterned in conductive paths to carry signals of the circuits. The blocks are formed in an intermediate region 102 of the memory device. In an upper region 103 of the memory device, one or more upper metal layers are patterned in conductive paths to carry signals of the circuits. Each block comprises a stacked area of memory cells, where alternating levels of the stack represent word lines. While two blocks are depicted as an example, additional blocks can be used, extending in the x- and/or y-directions.

In one example implementation, the length of the plane in the x-direction, represents a direction in which signal paths for word lines extend (a word line or SGD line direction), and the width of the plane in the y-direction, represents a direction in which signal paths for bit lines extend (a bit line direction). The z-direction represents a height of the memory device.

Figure 2B:
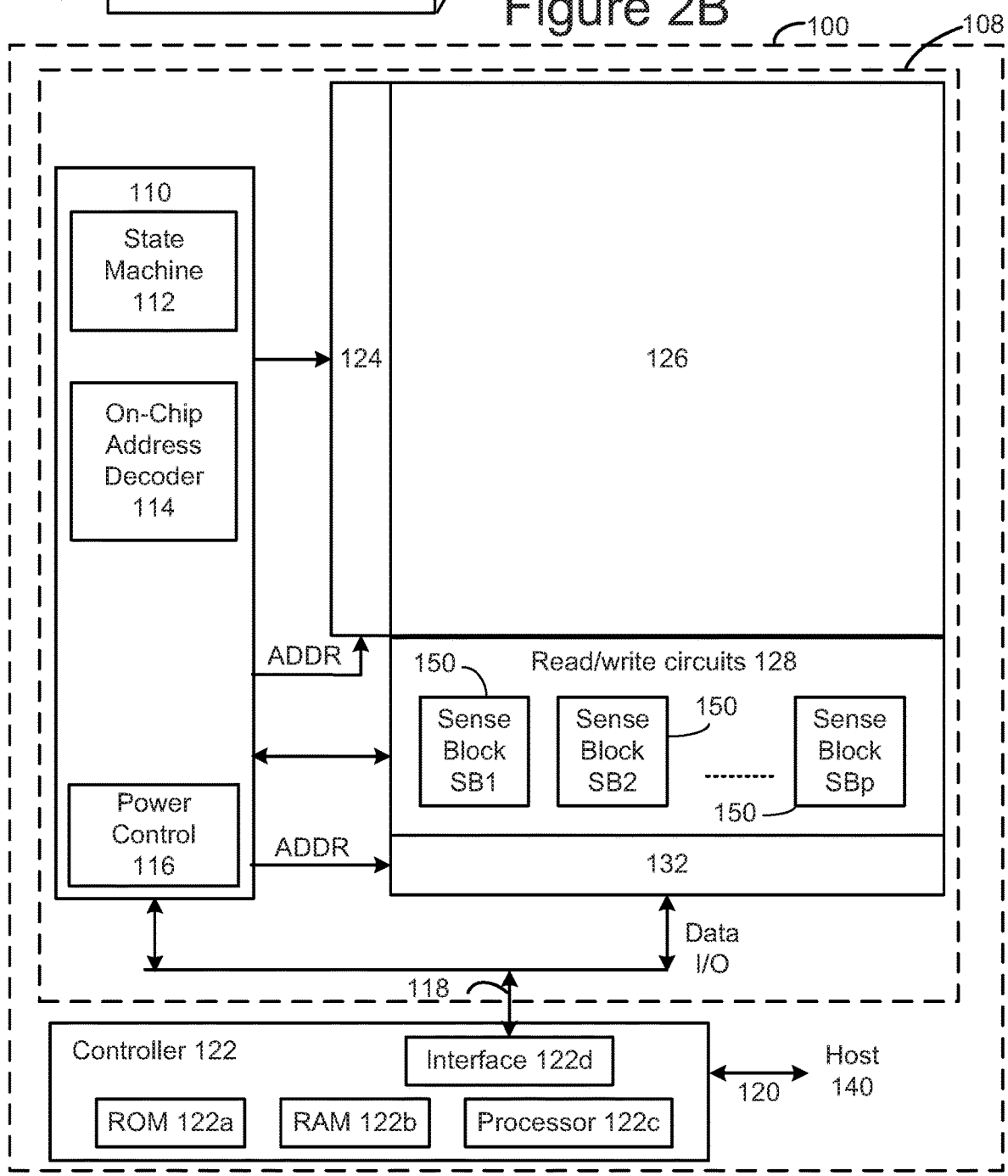
FIG. 2B is a functional block diagram of a memory device such as the 3D stacked non-volatile memory device 100 of FIG. 1.

FIG. 2B is a functional block diagram of an example memory device such as the 3D stacked non-volatile memory device 100 of FIG. 2A. The components depicted in FIG. 2B are electrical circuits. Memory device 100 includes one or more memory die 108. Each memory die 108 includes a three dimensional memory structure 126 of memory cells (such as, for example, a 3D array of memory cells), control circuitry 110, and read/write circuits 128. In other embodiments, a two dimensional array of memory cells can be used. Memory structure 126 is addressable by word lines via a row decoder 124 and by bit lines via a column decoder 132. The read/write circuits 128 include multiple sense blocks 150 including SB1, SB2, . . . , SBp (sensing circuitry) and allow a page of memory cells to be read or programmed in parallel. In some systems, a controller 122 is included in the same memory device 100 (e.g., a removable storage card) as the one or more memory die 108. However, in other systems, the controller can be separated from the memory die 108. In some embodiments controller 122 will be on a different die than memory die 108. In some embodiments, one controller 122 will communicate with multiple memory die 108. In other embodiments, each memory die 108 has its own controller. Commands and data are transferred between the host 140 and controller 122 via a data bus 120, and between controller 122 and the one or more memory die 108 via lines 118. In one embodiment, memory die 108 includes a set of input and/or output (I/O) pins that connect to lines 118.

Memory structure 126 may comprise one or more arrays of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate. In one embodiment, memory structure 126 implements three dimensional NAND flash memory. Other embodiments include two dimensional NAND flash memory, two dimensional NOR flash memory, ReRAM cross-point memories, magnetoresistive memory (e.g., MRAM), phase change memory (e.g., PCRAM), and others.

Control circuitry 110 cooperates with the read/write circuits 128 to perform memory operations (e.g., erase, program, read, and others) on memory structure 126, and includes a state machine 112, an on-chip address decoder 114, a power control module 116. The state machine 112 provides die-level control of memory operations. In one embodiment, state machine 112 is programmable by the software. In other embodiments, state machine 112 does not use software and is completely implemented in hardware (e.g., electrical circuits). In one embodiment, control circuitry 110 includes registers, ROM fuses and other storage devices for storing default values such as base voltages and other parameters.

The on-chip address decoder 114 provides an address interface between addresses used by host 140 or controller 122 to the hardware address used by the decoders 124 and 132. Power control module 116 controls the power and voltages supplied to the word lines and bit lines during memory operations. It can include drivers for word line layers (discussed below) in a 3D configuration, select transistors (e.g., SGS and SGD transistors, described below) and source lines. Power control module 116 may include charge pumps for creating voltages. The sense blocks include bit line drivers. An SGS transistor is a select gate transistor at a source end of a NAND string, and an SGD transistor is a select gate transistor at a drain end of a NAND string.

Any one or any combination of control circuitry 110, state machine 112, decoders 114/124/132, power control module 116, sense blocks 150, read/write circuits 128, and controller 122 can be considered a control circuit that performs the functions described herein.

The (on-chip or off-chip) controller 122 (which in one embodiment is an electrical circuit) may comprise one or more processors 122c, ROM 122a, RAM 122b, Memory Interface 122d, all of which are interconnected. One or more processors 122c is one example of a control circuit. Other embodiments can use state machines or other custom circuits designed to perform one or more functions. The storage devices (ROM 122a, RAM 122b) comprises code such as a set of instructions, and the processor 122c is operable to execute the set of instructions to provide the functionality described herein. Alternatively or additionally, processor 122c can access code from a storage device in the memory structure, such as a reserved area of memory cells connected to one or more word lines. Memory interface 122d, in communication with ROM 122a, RAM 122b and processor 122c, is an electrical circuit (electrical interface) that provides an electrical interface between controller 122 and one or more memory die 108. For example, memory interface 122d can change the format or timing of signals, provide a buffer, isolate from surges, latch I/O, etc. Processor 122c can issue commands to control circuitry 110 (or any other component of memory die 108) via Memory Interface 122d.

Multiple memory elements in memory structure 126 may be configured so that they are connected in series or so that each element is individually accessible. By way of non-limiting example, flash memory devices in a NAND configuration (NAND flash memory) typically contain memory elements connected in series. A NAND string is an example of a set of series-connected memory cells and select gate transistors.

A NAND flash memory array may be configured so that the array is composed of multiple NAND strings of which a NAND string is composed of multiple memory cells sharing a single bit line and accessed as a group. Alternatively, memory elements may be configured so that each element is individually accessible, e.g., a NOR memory array. NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

A three dimensional memory array is arranged so that memory cells occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory cells. The vertical columns may be arranged in a two dimensional configuration, e.g., in an x-y plane, resulting in a three dimensional arrangement of memory cells, with memory cells on multiple vertically stacked memory planes. Other configurations of memory elements in three dimensions can also constitute a three dimensional memory array.

By way of non-limiting example, in a three dimensional NAND memory array, the memory elements may be coupled together to form vertical NAND strings that traverse across multiple horizontal levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

A person of ordinary skill in the art will recognize that the technology described herein is not limited to a single specific memory structure, but covers many relevant memory structures within the spirit and scope of the technology as described herein and as understood by one of ordinary skill in the art.

Figure 3:
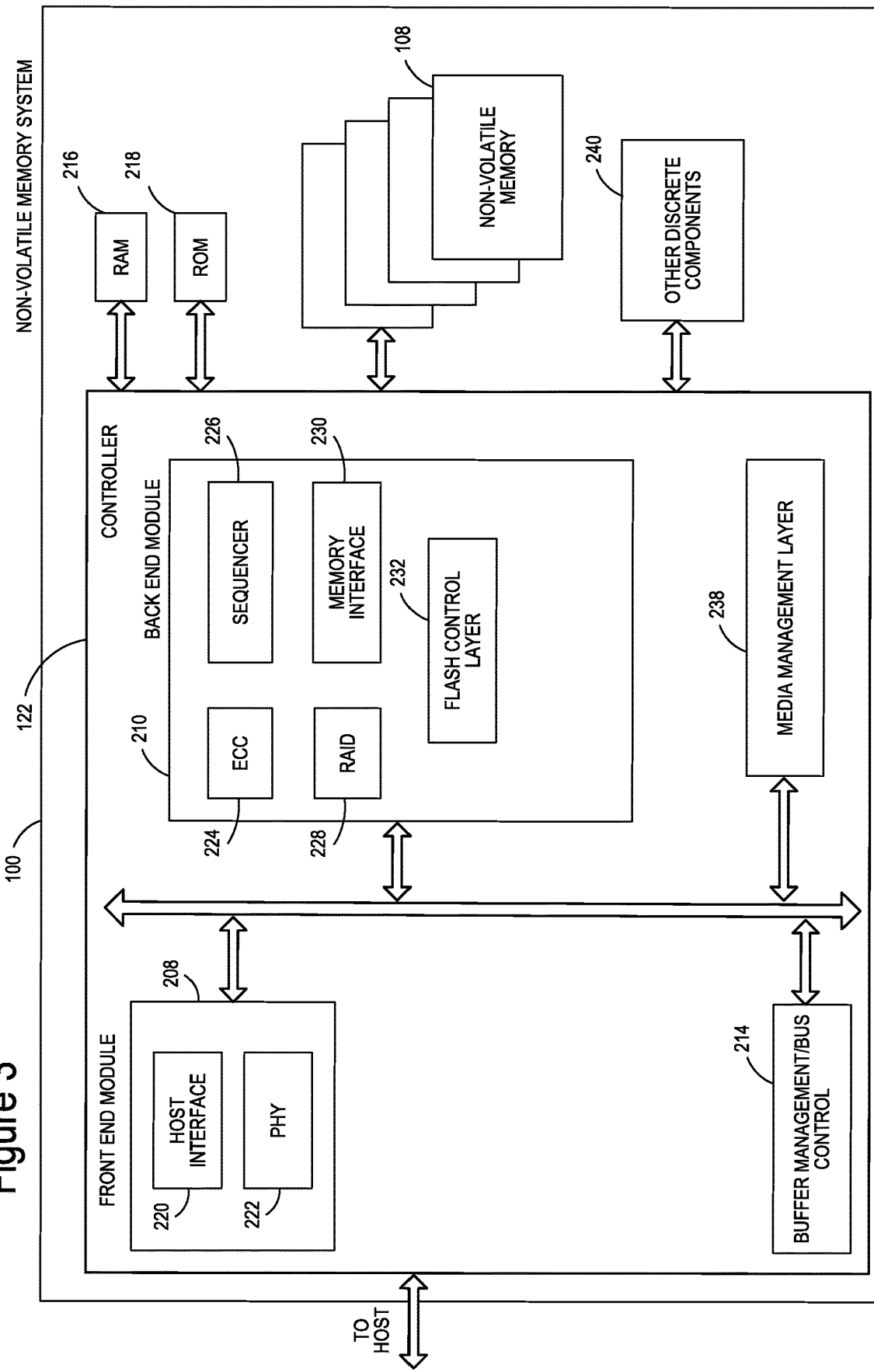
FIG. 3 is a block diagram depicting one embodiment of a memory system.

FIG. 3 is a block diagram of example memory system 100, depicting more details of one embodiment of controller 122. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between controller 122 and non-volatile memory die 108 may be any suitable flash interface, such as Toggle Mode 200, 400, or 800. In one embodiment, memory system 100 may be a card based system, such as a secure digital (SD) or a micro secure digital (micro-SD) card. In an alternate embodiment, memory system 100 may be part of an embedded memory system. For example, the flash memory may be embedded within the host. In other example, memory system 100 can be in the form of a solid state drive (SSD) drive.

In some embodiments, non-volatile memory system 100 includes a single channel between controller 122 and non-volatile memory die 108, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if a single channel is shown in the drawings.

As depicted in FIG. 3, controller 122 includes a front end module 208 that interfaces with a host, a back end module 210 that interfaces with the one or more non-volatile memory die 108, and various other modules that perform functions which will now be described in detail.

The components of controller 122 depicted in FIG. 3 may take the form of a packaged functional hardware unit (e.g., an electrical circuit) designed for use with other components, a portion of a program code (e.g., software or firmware) executable by a (micro) processor or processing circuitry that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include software stored in a processor readable device (e.g., memory) to program a processor for controller 122 to perform the functions described herein. The architecture depicted in FIG. 3 is one example implementation that may (or may not) use the components of controller 122 depicted in FIG. 2 (i.e. RAM, ROM, processor, interface).

Referring again to modules of the controller 122, a buffer manager/bus control 214 manages buffers in random access memory (RAM) 216 and controls the internal bus arbitration of controller 122. A read only memory (ROM) 218 stores system boot code. Although illustrated in FIG. 3 as located separately from the controller 122, in other embodiments one or both of the RAM 216 and ROM 218 may be located within the controller. In yet other embodiments, portions of RAM and ROM may be located both within the controller 122 and outside the controller. Further, in some implementations, the controller 122, RAM 216, and ROM 218 may be located on separate semiconductor die.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction code (ECC) engine 224 that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as an extra die or dies as implied by the common name, but it may also be added within the existing die, e.g. as an extra plane, or extra block, or extra WLs within a block. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or 800 interface. A flash control layer 232 controls the overall operation of back end module 210.

Additional components of system 100 illustrated in FIG. 3 include media management layer 238, which performs wear leveling of memory cells of non-volatile memory die 108. System 100 also includes other discrete components 240, such as external electrical interfaces, external RAM, resistors, capacitors, or other components that may interface with controller 122. In alternative embodiments, one or more of the physical layer interface 222, RAID module 228, media management layer 238 and buffer management/bus controller 214 are optional components that are not necessary in the controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the flash memory 126 of die 108. The MML 238 may be needed because: 1) the flash memory may have limited endurance; 2) the flash memory 126 may only be written in multiples of pages; and/or 3) the flash memory 126 may not be written unless it is erased as a block. The MML 238 understands these potential limitations of the flash memory 126 which may not be visible to the host. Accordingly, the MML 238 attempts to translate the writes from host into writes into the flash memory 126. As described below, erratic bits may be identified and recorded using the MML 238. This recording of erratic bits can be used for evaluating the health of blocks and/or word lines (the memory cells on the word lines).

Controller 122 may interface with one or more memory dies 108. In one embodiment, controller 122 and multiple memory dies (together comprising non-volatile storage system 100) implement a solid state drive (SSD), which can emulate, replace or be used instead of a hard disk drive inside a host, as a NAS device, laptop, tablet, etc. Additionally, the SSD need not be made to work as a hard drive.

Figure 3A:
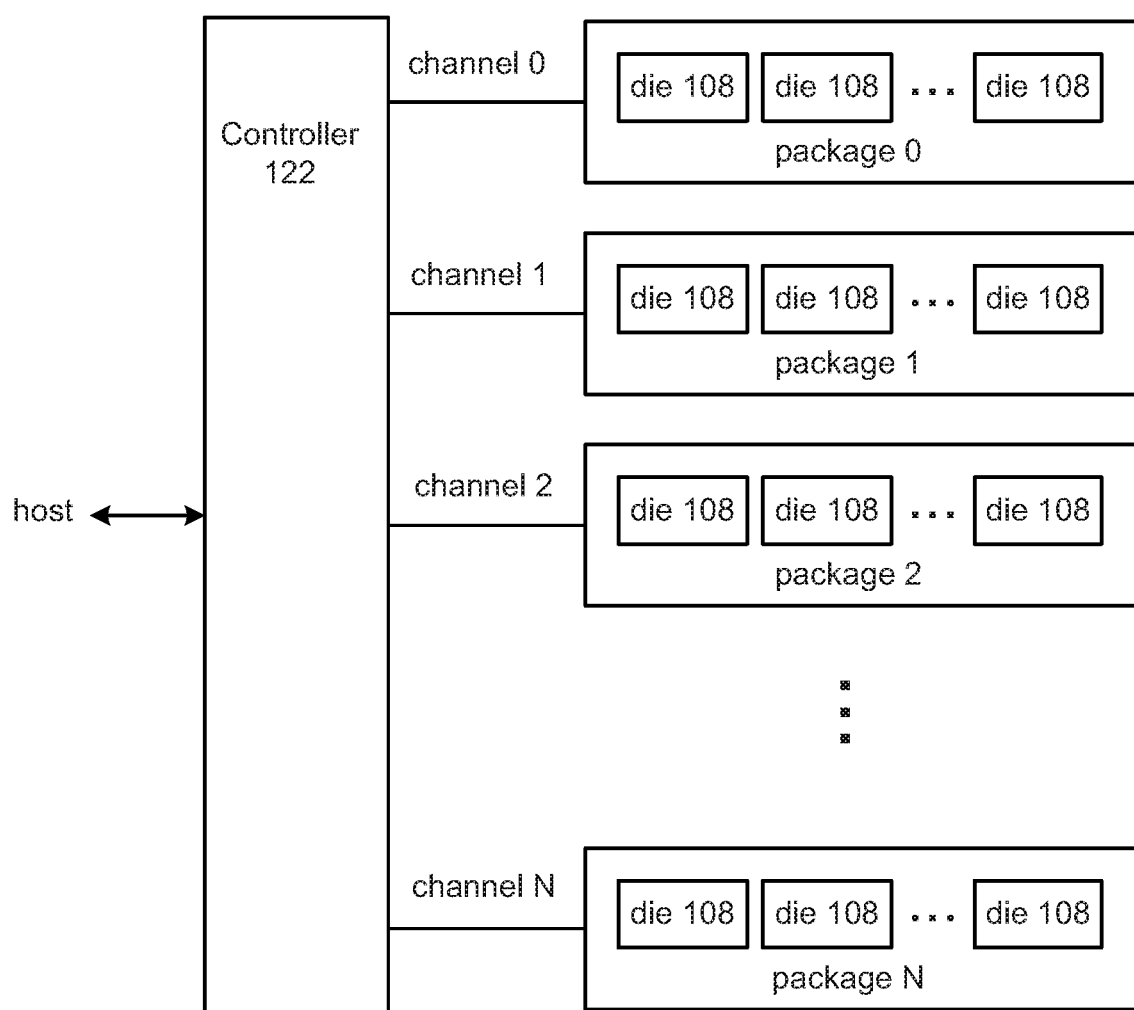
FIG. 3A is a block diagram depicting one embodiment of a memory system.

Some embodiments of a non-volatile storage system will include one memory die 108 connected to one controller 122. However, other embodiments may include multiple memory die 108 in communication with one or more controllers 122. In one example, depicted in FIG. 3A, the multiple memory die can be grouped into a set of memory packages. Each memory package includes one or more memory die in communication with controller 122. FIG. 6 shows N+1 memory packages (package 0-package N), and N+1 channels (channel 0-channel N) for communication between controller 122 and the memory dies 108 of respective memory packages 0-N. In one embodiment, a memory package includes a printed circuit board (or similar structure) with one or more memory die 108 mounted thereon. In some embodiments, a memory package can include molding material to encase the memory dies 108 of the memory package. In one embodiment, a memory package can be a single memory die 108. In some embodiments, controller 122 is physically separate from any of the memory packages.

Figure 3B:
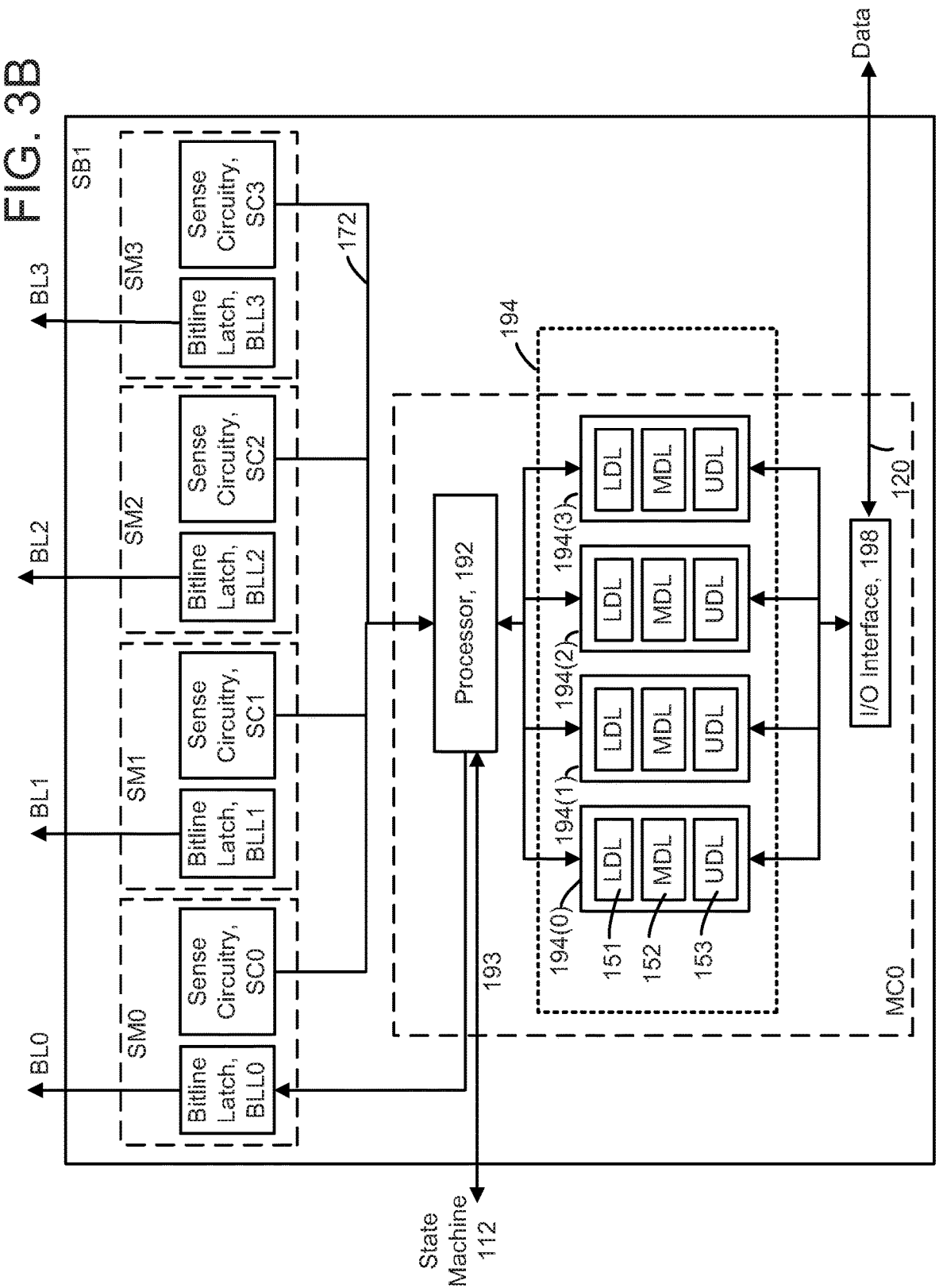
FIG. 3B is a block diagram depicting one embodiment of the sense block SB1 of FIG. 2B.

FIG. 3B is a block diagram depicting one embodiment of the sense block SB1 of FIG. 2B. The sense block is partitioned into one or more core portions, referred to as sense modules (e.g., SM0) or sense amplifiers, and a common portion, referred to as a managing circuit (e.g., MC0). In one embodiment, there is a separate sense module for each bit line and one common managing circuit for a set of sense modules, such as SM0, SM1, SM2 and SM3. Each of the sense modules in a group communicates with the associated managing circuit via a data bus 172. Thus, there are one or more managing circuits which communicate with the sense modules of a set of memory cells.

Each sense module SM0, SM1, SM2 and SM3 comprises sense circuitry SC0, SC1, SC2 and SC3, respectively, that performs sensing by determining whether a conduction current in a connected bit line BL0, BL1, BL2 and BL3, respectively, is above or below a predetermined threshold voltage (verify voltage). Each sense module SM0, SM1, SM2 and SM3 also includes a bit line latch BLL0, BLL1, BLL2 and BLL3, respectively, that is used to set a voltage condition on the connected bit line. For example, during a programming operation, a predetermined state latched in a bit line latch will result in the connected bit line being pulled to a lockout state (e.g., 1.5-3 V), a slow programming state (e.g., 0.5-1 V) or a normal programming state (e.g., 0 V).

Managing circuit MC0 comprises a processor 192, four example sets of data latches 194(0), 194(1), 194(2) and 194(3) and an I/O interface 198 coupled between the sets of data latches 194 and the data bus 120. In this example, each set of latches is associated with one of the bit lines. For example, data latches 194(0) are associated with bit line BL0, data latches 194(1) are associated with bit line BL1, data latches 194(2) are associated with bit line BL2, and data latches 194(3) are associated with bit line BL3. Each set of data latches includes data latches identified by LDL 151, MDL 152, and UDL153, in this embodiment. LDL 151 stores a bit for a lower page (LP) of write data, MDL 152 stores a bit for a middle page (MP) of write data, and UDL 153 stores a bit for an upper page (UP) of write data, in a memory which stores three bits of data in each memory cell.

Note that there may be one set of such latches associated with each bit line. Thus, there may be a page of latches 194 associated with a page of memory cells. The latches 194 may also be used to store data read from the non-volatile memory cells.

Additional or fewer data latches per set could be used as well. For example, in a two-bit per memory cell implementation, the MDL data latch for the middle page (MP) of data is not needed. A four-bit per memory cell implementation can use LDL, LMDL (lower-middle page), UMDL (upper-middle page), and UDL latches. The techniques provided herein are meant to encompass such variations. In a further option, another latch is used to identify whether a memory cell is in a slow programming mode when its Vth is within a specified margin of the verify voltage of its target data state.

The processor 192 performs computations during reading and programming. For reading, the processor determines the data state stored in the sensed memory cell and stores the data in the set of data latches. For full programming and refresh programming, the processor reads the latches to determine the data state which is to be written to a memory cell.

During reading, the operation of the system is under the control of the state machine 112 which controls the supply of different control gate voltages to the addressed memory cell. As it steps through the various predefined control gate voltages (e.g., Vr1, Vr2, Vr3, Vr4, Vr5, Vr6, and Vr7 in FIG. 5) corresponding to the various memory states supported by the memory (e.g., states S1, S2, S3, S4, S5, S6, and S7), the sense module may trip at one of these voltages and a corresponding output will be provided from the sense module to the processor 192 via the data bus 172. At that point, processor 192 determines the memory state by consideration of the tripping event(s) of the sense module and the information about the applied control gate voltage from the state machine via input lines 193. It then computes a binary encoding for the memory state and stores the resultant data bits into the data latches 194. For example, the memory state for a memory cell associated with bit line BL0 may be stored in latches 194(0), etc. In another embodiment of the managing circuit MC0, the bit line latch serves both as a latch for latching the output of the sense module and also as a bit line latch as described above.

Some implementations can include multiple processors. In one embodiment, each processor will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with four sense modules, the state machine needs to read the wired-OR line four times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations, the data to be programmed (write data) is stored in the data latches 194 from the data bus 120, in the LP, MP, and UP data latches. For example, the data to be programmed in a selected memory cell associated with bit line BL0 may be stored in latches 194(0), the data to be programmed in a selected memory cell associated with bit line BL1 may be stored in latches 194(1), etc. The programming operation, under the control of the state machine, comprises a series of programming voltage pulses applied to the control gates of the addressed memory cells. Each programming voltage is followed by a read back (verify test) to determine if the memory cell has been programmed to the desired memory state. In some cases, processor monitors the read back memory state relative to the desired memory state. When the two states agree, the processor sets the bit line latch to cause the bit line to be pulled to a state designating program inhibit (e.g., 2-3 V). This inhibits the memory cell coupled to the bit line from further programming even if programming voltages appear on its control gate. In other embodiments, the processor initially loads the bit line latch and the sense circuitry sets it to an inhibit value during the verify process.

Each set of data latches 194 may be implemented as a stack of data latches for each sense module. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Figure 4:
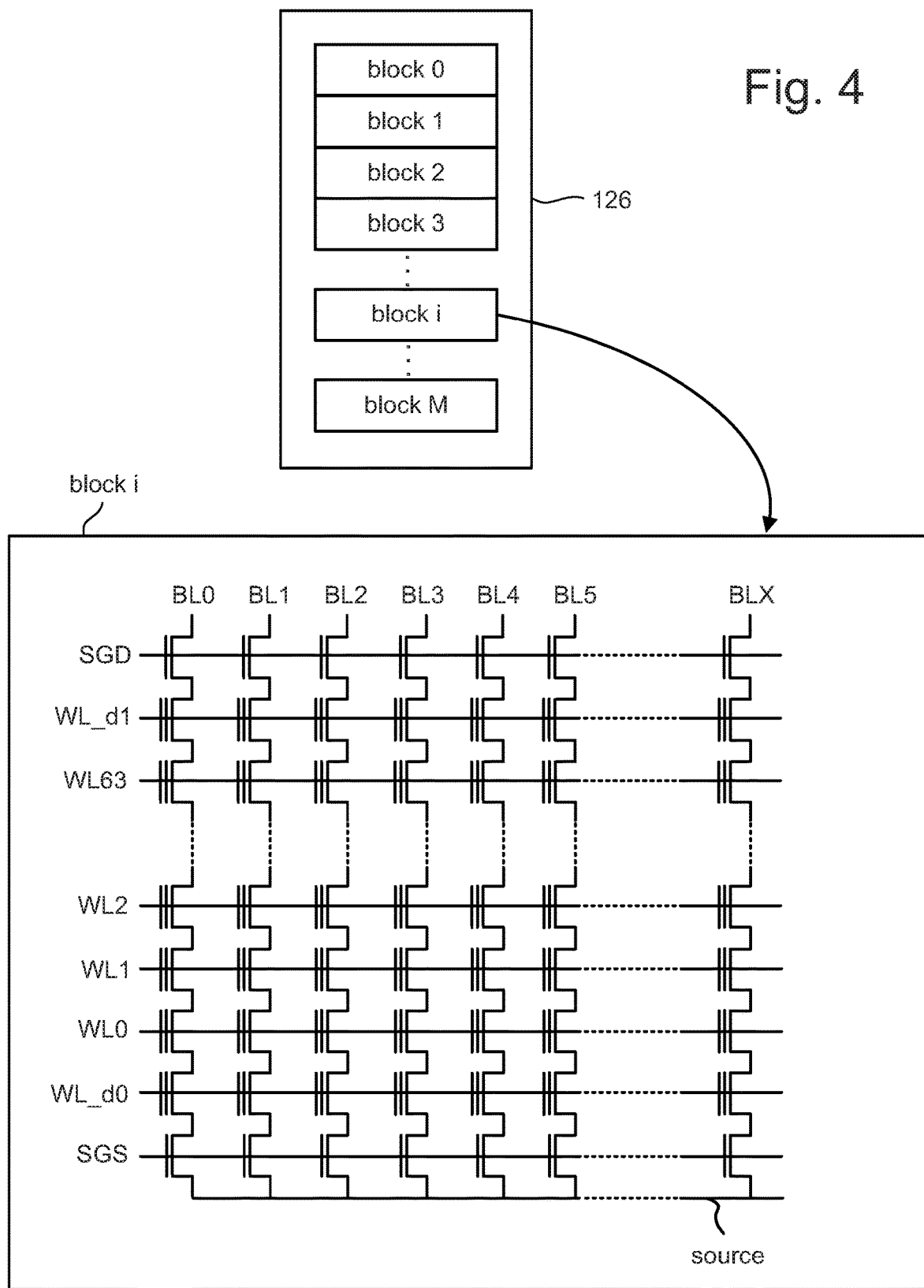
FIG. 4 depicts an exemplary structure of memory cell array 126.

FIG. 4 depicts an exemplary structure of memory cell array 126. In one embodiment, the array of memory cells is divided into M blocks of memory cells. The block is the unit of erase. That is, each block contains the minimum number of memory cells that are erased together. Each block is typically divided into a number of pages. A page is a unit of programming. One or more pages of data are typically stored in one row of memory cells. A page can store one or more sectors. A sector includes user data and overhead data. Overhead data typically includes parity bits of an Error Correction Code (ECC) that have been calculated from the user data of the sector. A portion of the controller calculates the ECC parity when data is being programmed into the array, and also checks it when data is being read from the array. Alternatively, the ECCs and/or other overhead data are stored in different pages, or even different blocks, than the user data to which they pertain.

FIG. 4 also shows more details of one embodiment of block i of memory array 126. Block i includes X+1 bit lines and X+1 NAND strings. Block i also includes 64 data word lines (WL0-WL63), 2 dummy word lines (WL_d0 and WL_d1), a drain side select line (SGD) and a source side select line (SGS). One terminal of each NAND string is connected to a corresponding bit line via a drain select gate (connected to select line SGD), and another terminal is connected to the source line via a source select gate (connected to select line SGS). Because there are sixty four data word lines and two dummy word lines, each NAND string includes sixty four data memory cells and two dummy memory cells. In other embodiments, the NAND strings can have more or fewer than 64 data memory cells and more or fewer dummy memory cells. Data memory cells can store user or system data. Dummy memory cells are typically not used to store user or system data. Some embodiments do not include dummy memory cells.

The memory systems discussed above can be erased, programmed and read. At the end of a successful programming process (with verification), the threshold voltages of the memory cells should be within one or more distributions of threshold voltages for programmed memory cells or within a distribution of threshold voltages for erased memory cells, as appropriate. FIG. 5 illustrates example threshold voltage distributions for the memory cell array when each memory cell stores three bits of data. Other embodiments, however, may use other data capacities per memory cell (e.g., such as one, two, four, or five bits of data per memory cell). FIG. 5 shows eight threshold voltage distributions, corresponding to eight data states. The first threshold voltage distribution (data state) S0 represents memory cells that are erased. The other seven threshold voltage distributions (data states) S1-S7 represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

FIG. 5 also shows seven read reference voltages, Vr1, Vr2, Vr3, Vr4, Vr5, Vr6, and Vr7, for reading data from memory cells. By testing (e.g., performing sense operations) whether the threshold voltage of a given memory cell is above or below the seven read reference voltages, the system can determine what data state (i.e., S0, S1, S2, S3, . . . ) a memory cell is in.

FIG. 5 also shows seven verify reference voltages, Vv1, Vv2, Vv3, Vv4, Vv5, Vv6, and Vv7. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

Figure 6A:
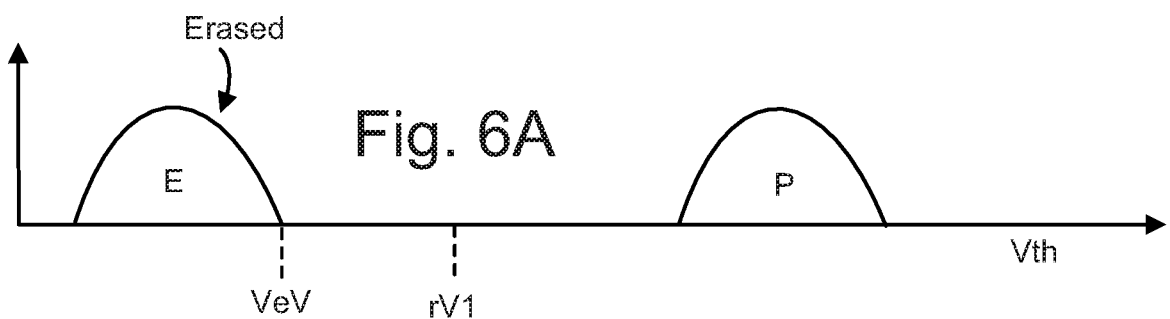
FIGS. 6A-6C illustrate an example of a population of two-state memory cells (Single Level Cells, or "SLC" cells).
Figure 6B:
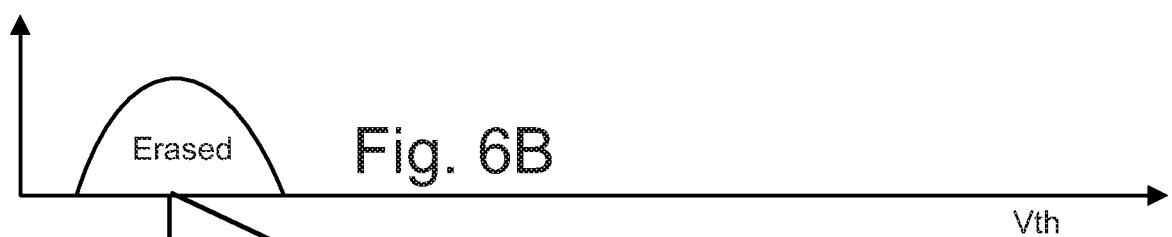
Figure 6C:
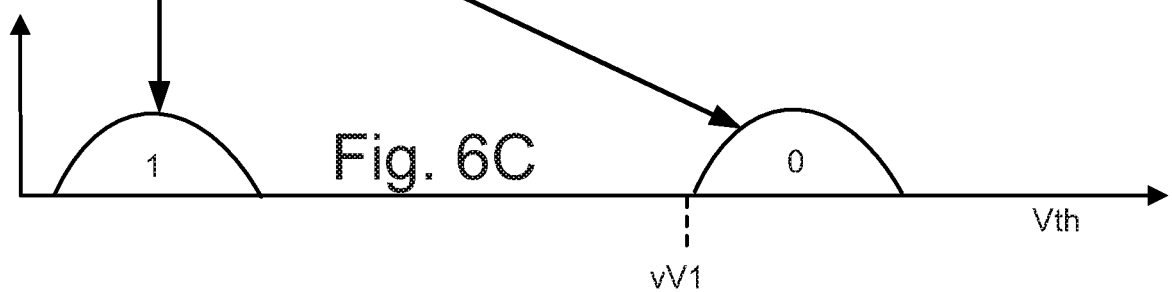

FIGS. 6A-6C illustrate an example of a population of two-state memory cells (Single Level Cells, or "SLC" cells). FIG. 6A illustrates how the population of memory cells are programmable into two distinct distributions of threshold voltages, an erased state, "E" and a programmed state, "P." Memory cells may be read by determining whether their threshold voltages are above or below a read voltage, rV1. FIG. 6B illustrates the initial distribution of "erased" threshold voltages for an erased memory. FIG. 6C illustrates an example of the memory after the memory cells have been programmed. Essentially, a cell initially has an "erased" threshold voltage and programming will move it to a higher value into a zone demarcated by verify level vV1. In this way, each memory cell can be programmed to the programmed state or remain un-programmed in the "erased" state. Binary bits, or logic states, are associated with each distribution. In the example shown, the erased distribution is associated with a logic state "1" and the programmed distribution is associated with a logic state "0."

Figure 7A:
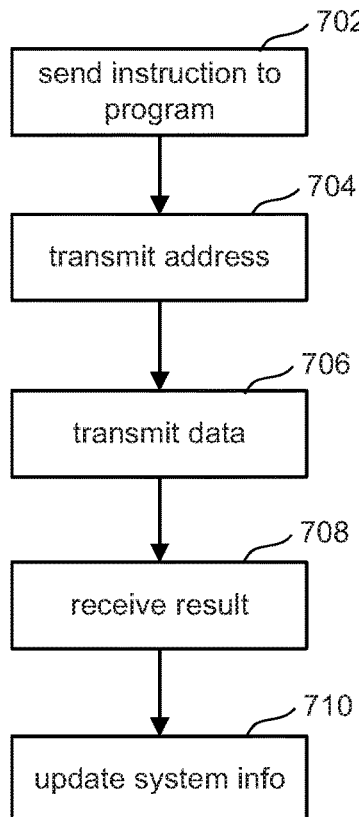
FIG. 7A is a flowchart describing one embodiment of a process for programming that is performed by controller.

FIG. 7A is a flowchart describing one embodiment of a process for programming that is performed by controller 122. In some embodiments, rather than have a dedicated controller, the host can perform the functions of the controller. In step 702, controller 122 sends instructions to one or more memory die 108 to program data. In step 704, controller 122 sends one or more addresses to one or more memory die 108. The one or more logical addresses indicate where to program the data. In step 706, controller 122 sends the data to be programmed to the one or more memory die 108. In step 708, controller 122 receives a result of the programming from the one or more memory die 108. Example results include that the data was programmed successfully, an indication that the programming operation failed, and indication that the data was programmed but at a different location, or other result. In step 710, in response to the result received in step 708, controller 122 updates the system information that it maintains. In one embodiment, the system maintains tables of data that indicate status information for each block. This information may include a mapping of logical addresses to physical addresses, which blocks/word lines are open/closed (or partially opened/closed), which blocks/word lines are bad, etc.

In some embodiments, before step 702, controller 122 would receive host data and an instruction to program from the host, and the controller would run the ECC engine 224 to create code words from the host data, as known in the art and described in more detail below. These code words are the data transmitted in step 706. Controller can also scramble the data to achieve wear leveling with respect to the memory cells.

Figure 7B:
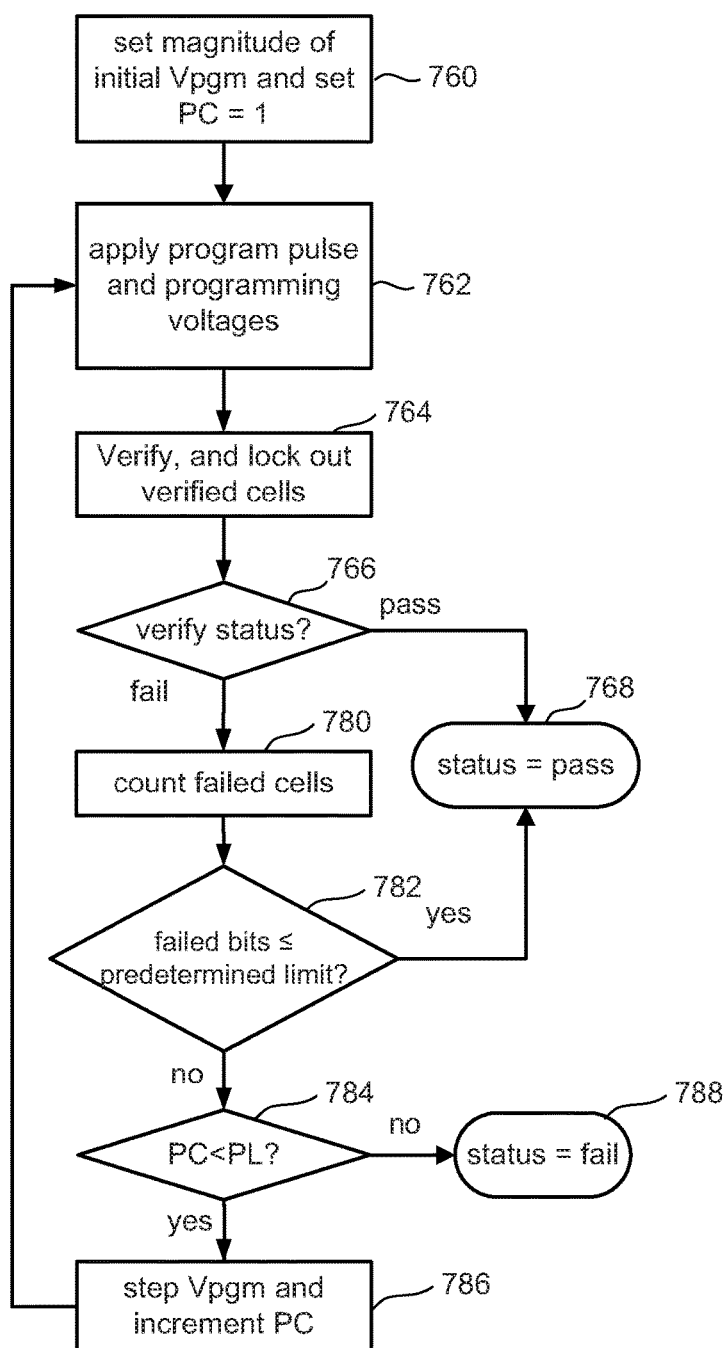
FIG. 7B is a flowchart describing one embodiment of a process for programming.

FIG. 7B is a flowchart describing one embodiment of a process for programming. The process of FIG. 7B is performed by the memory die in response to the steps of FIG. 7A (i.e., in response to the instructions, data and addresses from controller 122). In one example embodiment, the process of FIG. 7B is performed on memory die 108 using the one or more control circuits discussed above, at the direction of state machine 112. The process of FIG. 7B can also be used to implement the full sequence programming discussed above. Additionally, the process of FIG. 7B can be used to implement each phase of a multi-phase programming process.

Typically, the program voltage applied to the control gates (via a selected word line) during a program operation is applied as a series of program pulses. Between programming pulses are a set of verify pulses to perform verification. In many implementations, the magnitude of the program pulses is increased with each successive pulse by a predetermined step size. In step 760 of FIG. 7B, the programming voltage (Vpgm) is initialized to the starting magnitude (e.g., ~12-16V or another suitable level) and a program counter PC maintained by state machine 112 is initialized at 1. In step 762, a program pulse of the program signal Vpgm is applied to the selected word line (the word line selected for programming). In one embodiment, the group of memory cells being programmed concurrently are all connected to the same word line (the selected word line). The unselected word lines receive one or more boosting voltages (e.g., ~6-11 volts) to perform boosting schemes known in the art. If a memory cell should be programmed, then the corresponding bit line is grounded. On the other hand, if the memory cell should remain at its current threshold voltage, then the corresponding bit line is connected to Vdd to inhibit programming. In step 762, the program pulse is concurrently applied to all memory cells connected to the selected word line so that all of the memory cells connected to the selected word line are programmed concurrently. That is, they are programmed at the same time or during overlapping times (both of which are considered concurrent). In this manner all of the memory cells connected to the selected word line will concurrently have their threshold voltage change, unless they have been locked out from programming.

In step 764, the appropriate memory cells are verified using the appropriate set of verify reference voltages to perform one or more verify operations. In one embodiment, the verification process is performed by applying the testing whether the threshold voltages of the memory cells selected for programming have reached the appropriate verify reference voltage.

In step 766, it is determined whether all the memory cells have reached their target threshold voltages (pass). If so, the programming process is complete and successful because all selected memory cells were programmed and verified to their target states. A status of "PASS" is reported in step 768. If, in 766, it is determined that not all of the memory cells have reached their target threshold voltages (fail), then the programming process continues to step 780.

In step 780, the system counts the number of memory cells that have not yet reached their respective target threshold voltage distribution. That is, the system counts the number of memory cells that have, so far, failed the verify process. This counting can be done by the state machine, the controller, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 782, it is determined whether the count from step 780 is less than or equal to a predetermined limit. In one embodiment, the predetermined limit is the number of bits that can be corrected by error correction codes (ECC) during a read process for the page of memory cells. If the number of failed memory cells is less than or equal to the predetermined limit, than the programming process can stop and a status of "PASS" is reported in step 768. In this situation, enough memory cells programmed correctly such that the few remaining memory cells that have not been completely programmed can be corrected using ECC during the read process. In some embodiments, step 780 will count the number of failed cells for each sector, each target data state or other unit, and those counts will individually or collectively be compared to a threshold in step 782. Note that the fail bit count in steps 780-782 is a program verify fail bit count, and is distinguished from an erase verify fail bit count.

In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If number of failed memory cells is not less than the predetermined limit, than the programming process continues at step 784 and the program counter PC is checked against the program limit value (PL). Examples of program limit values include 12, 20 and 30; however, other values can be used. If the program counter PC is not less than the program limit value PL, then the program process is considered to have failed and a status of FAIL is reported in step 788. This is one example of a program fault. If the program counter PC is less than the program limit value PL, then the process continues at step 786 during which time the Program Counter PC is incremented by 1 and the program voltage Vpgm is stepped up to the next magnitude. For example, the next pulse will have a magnitude greater than the previous pulse by a step size (e.g., a step size of 0.1-0.5 volts). After step 786, the process loops back to step 762 and another program pulse is applied to the selected word line so that another iteration (steps 762-686) of the programming process of FIG. 7B is performed.

In general, during verify operations and read operations, the selected word line is connected to a voltage (one example of a reference signal), a level of which is specified for each read operation (e.g., see read compare levels Vr1, Vr2, Vr3, Vr4, Vr5, Vr6, and Vr7, of FIG. 5) or verify operation (e.g. see verify target levels Vv1, Vv2, Vv3, Vv4, Vv5, Vv6, and Vv7 of FIG. 5) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

In some embodiments, controller 122 receives a request from the host (or a client, user, etc.) to program host data (data received from the host) into the memory system. In some embodiments, controller 122 arranges the host data to be programmed into units of data. For example, controller 122 can arrange the host data into pages, word line units, blocks, jumbo blocks, or other units.

Figure 8B:
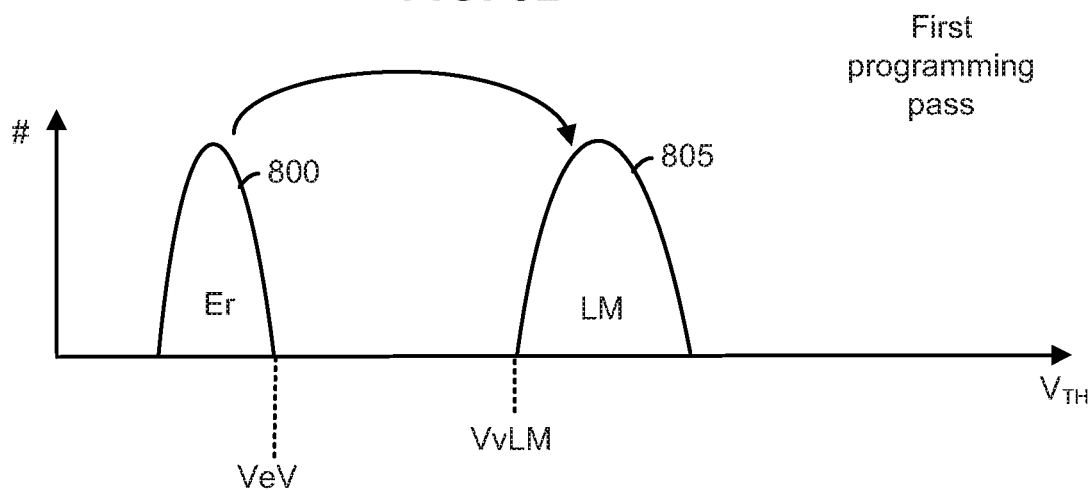
FIG. 8B depicts one embodiment of a first pass of a two-pass programming technique.
Figure 8C:
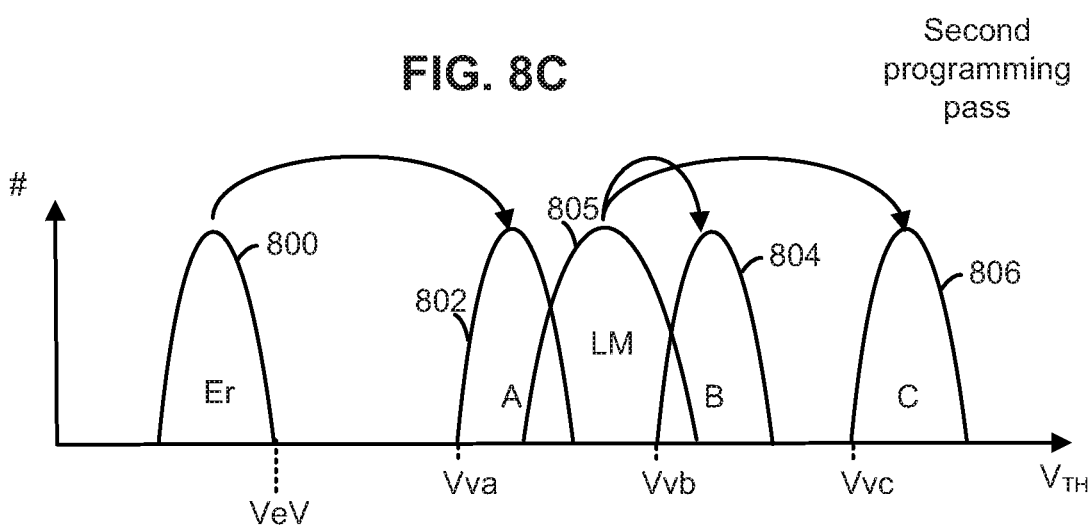
FIG. 8C depicts one embodiment of a second pass of the two-pass programming technique referred to in FIG. 8B.
Figure 8D:
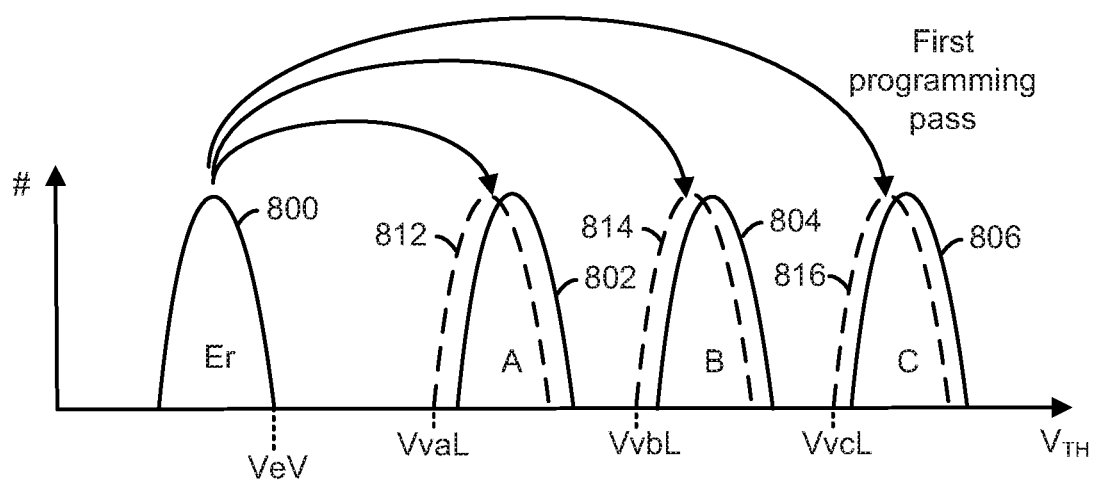
FIG. 8D depicts one embodiment of a first pass of another two-pass programming technique.
Figure 8E:
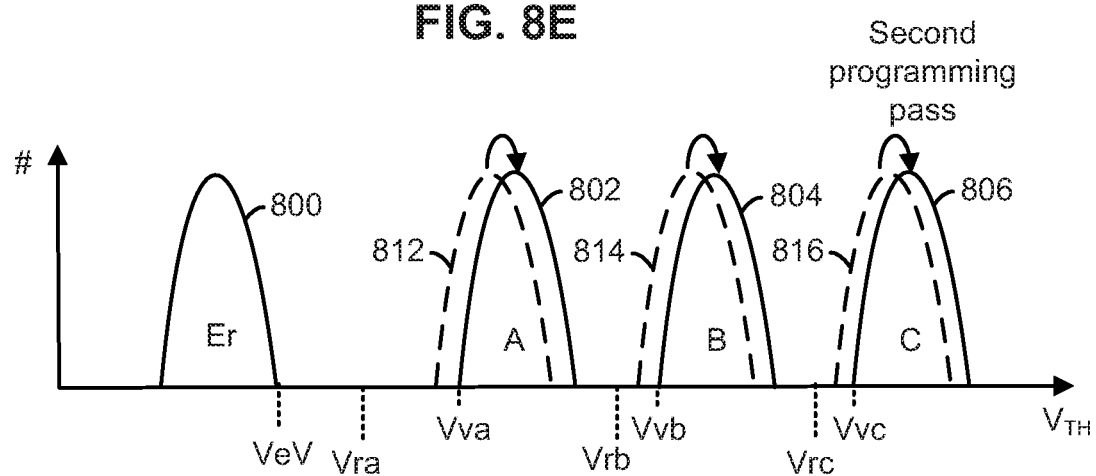
FIG. 8E depicts one embodiment of a second pass of the two-pass programming technique referred to in FIG. 8D.
Figure 8F:
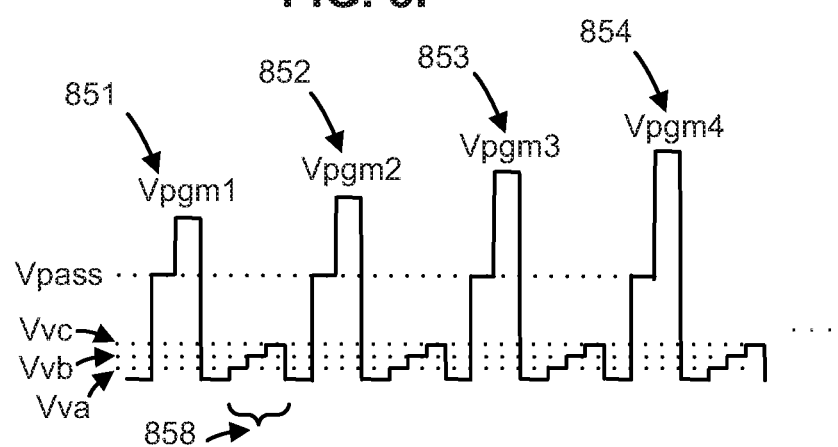
FIG. 8F depicts one embodiment of a series of program and verify pulses which are applied to a selected word line during a programming operation.

The programming process of FIG. 7B may be used to program memory cells to one bit per cell, two bits per cell, three bits per cell, four bits per cell, or some other number of bits per cell. Examples of three bits per cell and one bit per cell were discussed above in connection with FIGS. 5 and 6A-6C, respectively. FIGS. 8A-8C depict threshold voltage distributions and programming passes for one embodiment of programming memory cells to two bits per memory cell. FIGS. 8D-8F depict threshold voltage distributions and programming passes for another embodiment of programming memory cells to two bits per memory cell.

FIG. 8A depicts one embodiment of a set of threshold voltage distributions for a four-state memory device in which each storage element stores two bits of data. A first threshold voltage (Vth) distribution 800 is provided for erased (Er-state) storage elements. Three Vth distributions 802, 804 and 806 represent programmed states A, B and C, respectively. In one embodiment, the threshold voltages in the Er-state and the threshold voltages in the A, B and C distributions are positive. In another embodiment, the threshold voltage distribution for the Er-state is negative, while the threshold voltage distributions for the A-state, B-state and C-state distributions are positive.

Three read reference voltages, Vra, Vrb and Vrc, are also provided for reading data from storage elements. By testing whether the threshold voltage of a given storage element is above or below Vra, Vrb and Vrc, the system can determine the state, e.g., programming condition, the storage element is in.

Further, three verify reference voltages, Vva, Vvb and Vvc, are provided. When programming storage elements to the A-state, B-state or C-state, the system will test whether those storage elements have a threshold voltage greater than or equal to Vva, Vvb or Vvc, respectively.

In one embodiment, known as full sequence programming, storage elements can be programmed from the Er-state directly to any of the programmed states A, B or C. For example, a population of storage elements to be programmed may first be erased so that all storage elements in the population are in the Er-state. A series of program pulses may then be used to program storage elements directly into states A, B or C. While some storage elements are being programmed from the Er-state to the A-state, other storage elements are being programmed from the Er-state to the B-state and/or from the Er-state to the C-state.

Another option is to use low and high verify levels for one or more data states. For example, VvaL and Vva are lower and higher verify levels, respectively, for the A-state, VvbL and Vvb are lower and higher verify levels, respectively, for the B-state, and VvcL and Vvc are lower and higher verify levels, respectively, for the C-state. In some cases, VvcL is not used since reduced programming precision may be acceptable for the highest state. During programming, when the Vth of a storage element which is being programmed to the A-state as a target state exceeds VvaL, the programming speed of the storage element is slowed down, in a slow programming mode, such as by raising the associated bit line voltage to a level, e.g., 0.6-0.8 V, which is between a nominal program or non-inhibit level, e.g., 0 V and a full inhibit level, e.g., 4-6 V. This provides greater accuracy by avoiding large step increases in threshold voltage. When the Vth reaches Vva, the storage element is locked out from further programming. Similarly, when the Vth of a storage element which is being programmed to the B-state as a target state exceeds VvbL, the programming speed of the storage element is slowed down, and when the Vth reaches Vvb, the storage element is locked out from further programming. Optionally, when the Vth of a storage element which is being programmed to the C-state as a target state exceeds VvcL, the programming speed of the storage element is slowed down, and when the Vth reaches Vvc, the storage element is locked out from further programming. This programming technique has been referred to as a quick pass write or dual verify technique. Note that, in one approach, dual verify levels are not used for the highest state since some overshoot is typically acceptable for that state. Instead, the dual verify levels can be used for the programmed states, above the erased state, and below the highest state.

FIG. 8B depicts one embodiment of a first pass of a two-pass programming technique. In this example, a multi-state storage element stores data for two different pages: a lower page and an upper page. Four states are depicted by repeating the threshold voltage distributions 800, 802, 804 and 806 from FIG. 8A. These states, and the bits they represent, are: Er-state (11), A-state (01), B-state (00) and C-state (10). For Er-state, both pages store a "1." For A-state, the lower page stores a "1" and the upper page stores a "0." For B-state, both pages store "0." For C-state, the lower page stores "0" and the upper page stores "1." Note that although specific bit patterns have been assigned to each of the states, different bit patterns may also be assigned.

In the first programming pass, the lower page is programmed for a selected word line WLn. If the lower page is to remain data 1, then the storage element state remains at state Er (distribution 800). If the data is to be programmed to 0, then the threshold voltage of the storage elements on WLn are raised such that the storage element is programmed to an intermediate (LM or lower-middle) state (distribution 805).

FIG. 8C depicts one embodiment of a second pass of the two-pass programming technique referred to in FIG. 8B. The A-state storage elements are programmed from the Er-state distribution 800 to the A-state distribution 802, the B-state storage elements are programmed from the LM-state distribution 805 to the B-state distribution 804, and the C-state storage elements are programmed from the LM-state distribution 805 to the C-state distribution 806.

FIG. 8D depicts one embodiment of a first pass of another two-pass programming technique. In this example, referred to as foggy-fine (or course-fine) programming, the A-state, B-state and C-state storage elements are programmed from the Er-state to distributions 812, 814 and 816, respectively, using lower verify levels VvaL, VvbL and VvcL, respectively. This is the foggy (or course) programming pass. A relatively large program voltage step size may be used, for instance, to quickly program the storage elements to the respective lower verify levels.

FIG. 8E depicts one embodiment of a second pass of the two-pass programming technique referred to in FIG. 8D. The A-state, B-state and C-state storage elements are programmed from the respective lower distributions to respective final distributions 802, 804 and 806, respectively, using the nominal, higher verify levels Vva, Vvb and Vvc, respectively. This is the fine programming pass. A relatively small program voltage step size may be used, for instance, to slowly program the storage elements to the respective final verify levels while avoiding a large overshoot.

Although the programming examples depict four data states and two pages of data, the concepts described herein may be applied to other implementations with more or fewer than four states and more or fewer than two pages. For example, memory devices may utilize eight or sixteen states per storage element. Moreover, in the example programming techniques discussed herein, the Vth of a storage element may be raised gradually as it is programmed to a target data state. However, programming techniques may be used in which the Vth of a storage element may be lowered gradually as it is programmed to a target data state. Programming techniques which measure storage element current may be used as well. The concepts described herein may be adapted to the different programming techniques.

FIG. 8F depicts one embodiment of a series of program and verify pulses which are applied to a selected word line during a programming operation. A programming operation may include multiple program-verify iterations, in which each iteration applies one or more programming voltages followed by one or more verify voltages to the selected word line. In one embodiment, the programming voltages applied in a previous iteration may be stepped up in successive iterations. Moreover, the one or more programming voltages applied during a programming iteration may include a first portion which has a pass voltage (Vpass) level, e.g., 8-8 V, followed by a second, highest amplitude portion at a program level, e.g., 12-25 V. For example, a first, second, third and fourth program pulses 851, 852, 853 and 854 have program levels of Vpgm1, Vpgm2, Vpgm3 and Vpgm4, respectively. One or more verify voltages 858, such as verify voltages Vva, Vvb and Vvc, may be provided after each program pulse. In some cases, one or more initial program pulses are not followed by verify pulses because it is not expected that any storage elements have reached the lowest program state (e.g., A-state). Subsequently, in some cases, program iterations may use verify pulses for the A-state, followed by program iterations which use verify pulses for the A-states and B-states, followed by program iterations which use verify pulses for the B-states and C-states.

Figure 9:
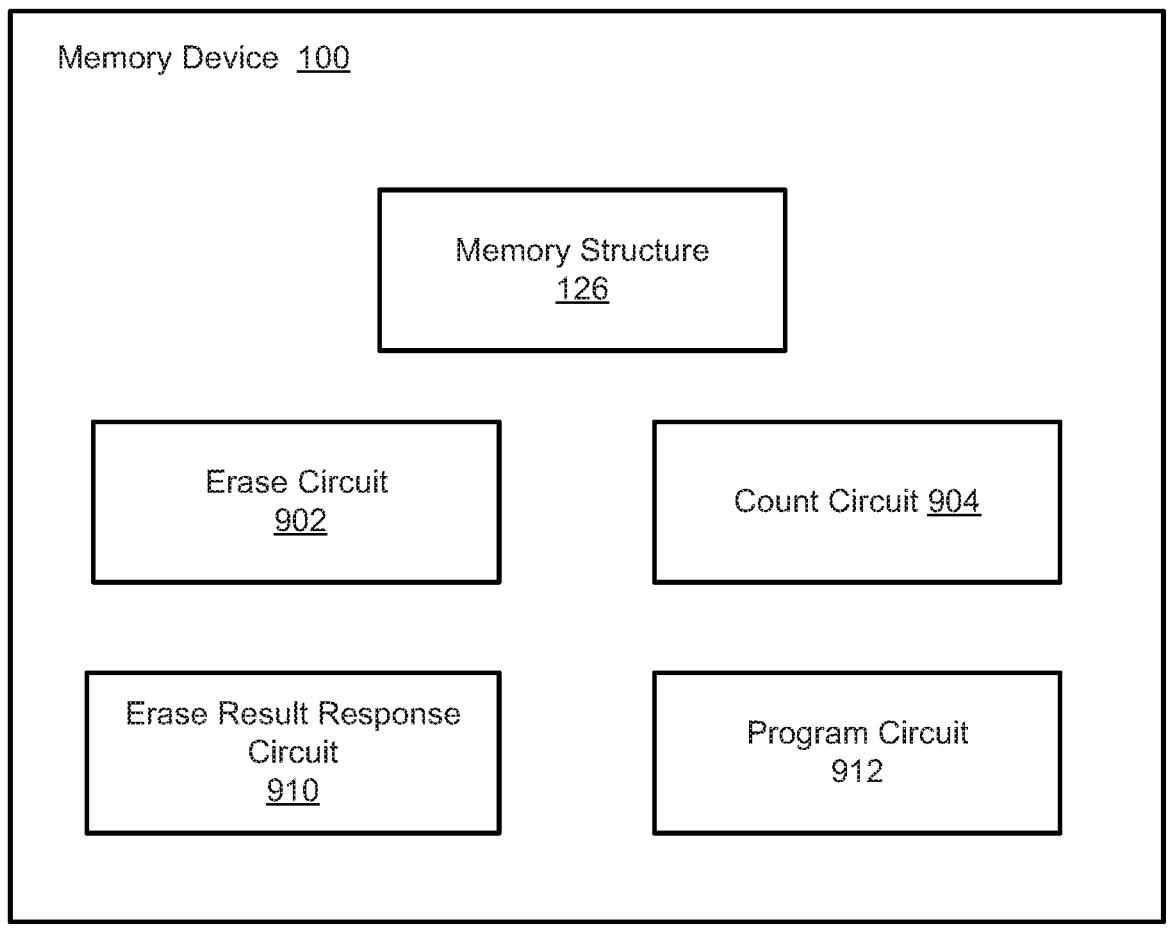
FIG. 9 is a block level diagram of one embodiment of a memory device.

FIG. 9 is a block level diagram of one embodiment of a memory device 100. The erase circuit 902 is configured to erase groups of memory cells in the memory structure 126. The erase circuit 902 is configured to perform process 10 of FIG. 1, in one embodiment. The erase circuit 902 is not limited to process 10. The erase circuit 902 is configured to output an erase status such as "Erase=Success" or "Erase=Fail."

The count circuit 904 is configured to count fail bits. The count circuit 904 may count the number of NAND strings that have failed to erase with respect to an erase verify reference voltage. The count circuit 904 may count the number of memory cells that have failed to program with respect to a program verify reference voltage. The count circuit 904 is not limited to these examples of determining fail bit counts.

The count circuit 904 receives output from the sense blocks associated with a group of NAND strings, in one embodiment. For example, the count circuit 904 may receive the content of one of the latches (e.g., LDL, MDL, UDL, or other latches). The count circuit 904 tabulates the content of those latches in one embodiment, to determine a fail bit count. In one embodiment, the count circuit 904 receives the content of the LDL latches, inverts the content, and tabulates the number of "1s" to determine a fail bit count. The count circuit 904 may invert the content of the LDL latches by performing an XOR with a second set of latches that all contain "1".

The erase result response circuit 910 is configured to determine whether there is an erase stuck bit condition, based on a result from the count circuit, in one embodiment. The erase result response circuit 910 is configured to take some action responsive to determining that there is an erase stuck bit condition. The erase result response circuit 910 increases an erase fail bit count responsive to detecting an erase stuck bit condition, in one embodiment. The erase result response circuit 910 takes a different action when the erase result response circuit 910 determines that an erase fail is not due to an erase stuck bit condition, in one embodiment.

The program circuit 912 is configured to program memory cells in the memory structure 126. The program circuit 912 is configured to program at either one bit per memory cell, or multiple bits per memory cell, in one embodiment. In one embodiment, the program circuit 912 is configured to "fold" data from a group of memory cells that store one bit per cell (e.g., SLC memory cells), to memory cells that store multiple bits per memory cell (e.g., MLC memory cells). The fold operation refers to reading the data from the SLC memory cells, and programming that data to MLC cells. The program circuit 912 performs error correction on the data read from the SLC cells prior to programming to the MLC cells, in one embodiment. To do so, the program circuit 912 may provide that data to controller 224. Thus, the data may be transferred off from the memory die 108 to perform the ECC. The program circuit 912 does not perform error correction on the data read from the SLC cells prior to programming to the MLC cells, in one embodiment. Thus, the data need not be transferred off from the memory die 108 to the controller, which is referred to herein as an "on-chip copy".

In one embodiment, the erase result response circuit 910 instructs the program circuit 912 whether to perform ECC or to perform an on-chip copy, depending on whether there is an erase stuck bit condition. In one embodiment, ECC is performed on the data read from the SLC memory cells when an erase stuck bit condition has been detected for this group of SLC memory cells. However, an on-chip copy is performed when there is not an erase stuck bit condition for the group of SLC memory cells.

The erase circuit 902, count circuit 904, erase result response circuit 910, and program circuit 912 may be implemented with various circuitry on the memory device 100. For example, one or more of controller 122, control circuitry 110, read/write circuits 128 and decoders 124/134 may be used. The erase circuit 902, count circuit 904, erase result response circuit 910, and program circuit 912 may take the form of a packaged functional hardware unit (e.g., an electrical circuit) designed for use with other components, a portion of a program code (e.g., software or firmware) executable by a (micro) processor or processing circuitry that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include software stored in a processor readable device (e.g., memory) to program a processor to perform the functions described herein.

Figure 10:
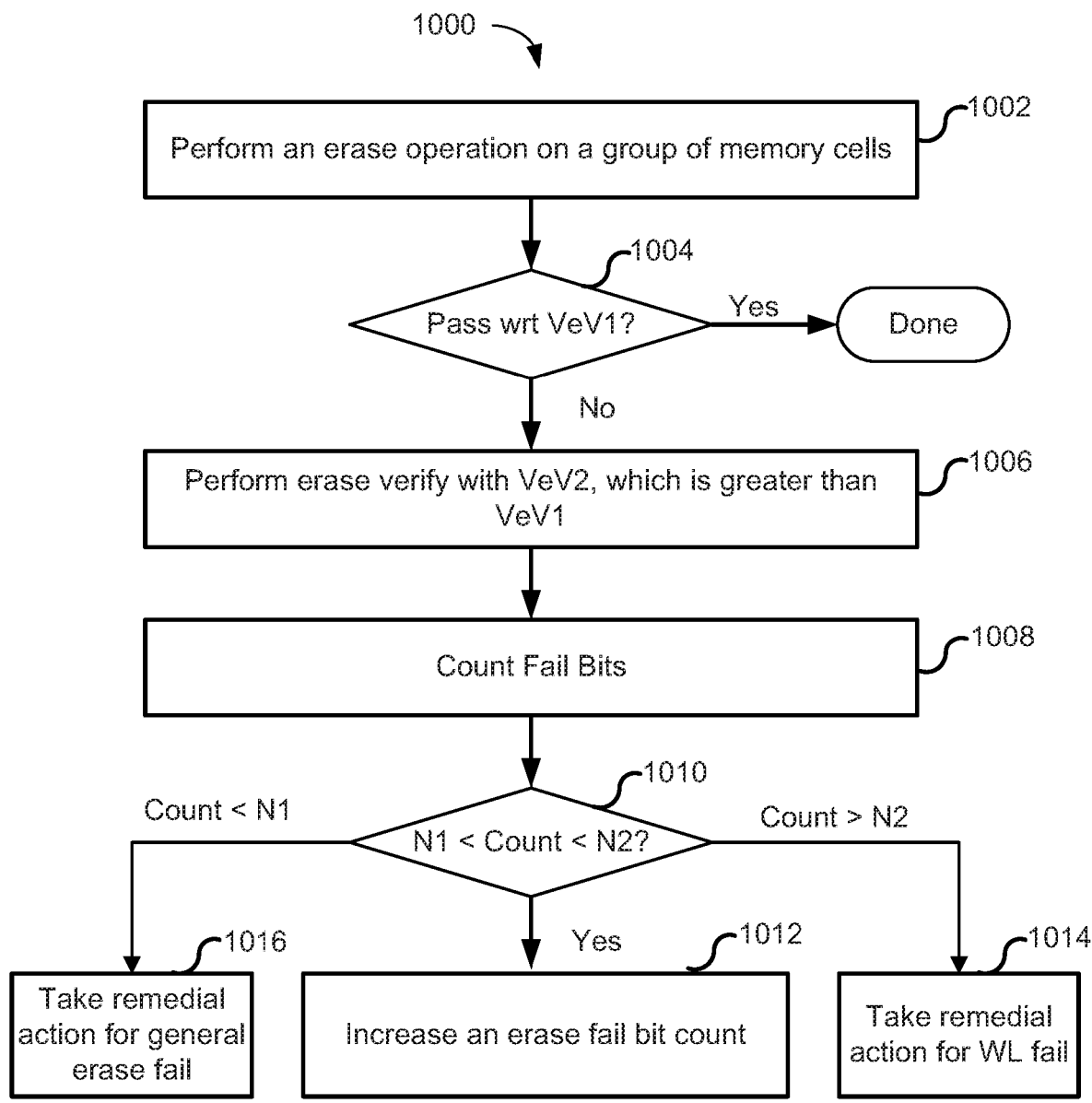
FIG. 10 is a flowchart of one embodiment of a process of operating non-volatile storage.

FIG. 10 is a flowchart of one embodiment of a process 1000 of operating non-volatile storage. The process 1000 is performed by a combination of one or more of controller 122, control circuitry 110, read/write circuits 128, and/or decoders 124/132, in one embodiment. The process 1000 is performed by erase circuit 902, count circuit 904 and erase result response circuit 910, in one embodiment.

Step 1002 includes performing an erase operation on a group of non-volatile memory cells. In one embodiment, the group includes NAND strings. NAND strings. In one embodiment, the group of non-volatile memory cells are a block of memory cells, such as one of the blocks in FIG. 4. The group of memory cells may be associated with a set of word lines, as in the example of FIG. 4.

In one embodiment, process 10 is performed in step 1002. However, step 1002 could use an erase operation other than process 10. Step 1002 may include determining whether the erase operation passed with respect to a verify reference level. This verify reference level will be referred to as VeV1 in the discussion of process 1000. If process 10 is used, then VeV1 is the erase verify reference voltage used in step 18. Note that process 10 may returns either Erase=Success or Erase=Fail. In one embodiment, erase circuit 902 performs step 1002. VeV1 can be, but is not limited to, any of the example VeV reference voltage levels shown and described herein with respect to FIG. 1A-1C, 5, 6A, or 8A.

In one embodiment of process 10, the erase fails if the incremented erase loop count exceeds the max (see step 28) while there are still more than an allowed number of NAND strings that have not yet passed erase verify. Note that the number of NAND strings that have not yet passed erase verify is one example of a fail bit count, as the term is used herein. Thus, note that the term "fail bit" in this context is being used to refer to a NAND string having at least one memory cell that has not yet had its threshold voltage reduced below the erase verify reference level.

Step 1004 is a conditional based on whether the erase operation passed with respect to the erase verify reference voltage VeV1. Thus, upon the condition that erase passed with respect to VeV1, the process 1000 concludes. For example, if erase process 10 returns Erase=Success, the process 1000 concludes after step 1004.

Upon the condition that erase failed with respect to VeV1, the process 1000 continues at step 1006. For example, if erase process 10 returns Erase=Fail, the process 1000 continues at step 1006.

Step 1006 is to perform an erase verify using an erase verify reference level (VeV2) that is greater than the erase verify reference level of the erase operation of step 1002. In one embodiment, the erase verify reference voltage "Vstuck" is used as VeV2. In step 1006, Vstuck may be applied to all of the word lines in the block. Note that the erase verify reference voltage in step 1006 is less stringent that the erase verify reference voltage used in step 1002. In one embodiment, VeV2 is completely above an expected upper tail of an erase distribution that passes the erase operation with respect to the VeV1. In one embodiment, VeV2 has a voltage magnitude that exceeds the threshold voltage of all bits that are in a normal distribution that passes erase. In one embodiment, VeV2 is 1V greater than VeV1. In one embodiment, VeV1 is 0V and VeV2 is 1V. In one embodiment, VeV2 is at least 1V greater than VeV1. In one embodiment, VeV1 is 0V and VeV2 is at least 1V.

Step 1008 is to count the fail bits with respect to VeV2. For example, a count is made of the number of NAND strings that failed to conduct a current in response to application of the erase verify voltage to the word lines. Step 1008 may thus determine the number of NAND strings that have at least one memory cell having a threshold voltage above Vstuck. Count circuit 904 performs step 1008, in one embodiment.

Step 1010 includes a conditional based on the count. The conditional compares the count to a first number (N1) and a second number (N2). The values for N1 and N2 may vary depending on the architecture and error correction capabilities of the memory system 100. In one embodiment, N1 is equal to the fail bit count for the erase procedure used in step 1002. In one embodiment, N2 is equal to a maximum number of bits that could be corrected using an ECC algorithm, such as used by ECC engine 224 in controller 122. This refers to the maximum number of bits per some unit of memory cells, such as memory cells on one word line. For example, the second number is equal to the maximum number of bits that could be corrected using an ECC algorithm used to correct errors in data read from the group of memory cells, in one embodiment. Note that only one word line of memory cells are programmed or read at one time, in one embodiment. Thus, only one memory cell per NAND string is programmed or read together, in one embodiment. The second number is equal to the maximum number of bits that could be corrected using an ECC algorithm used to correct errors in data read from one memory cell on each of the NAND strings, in one embodiment. However, note that the NAND string fail bit count may actually be a worst case fail bit count for the associated word lines, as it is not necessarily true that all memory cells on a NAND string are fail cases.

In the event that the count is between N1 and N2, this indicates an erase stuck bit condition. As one example, the condition depicted in FIG. 1B has been detected. Thus, an action may be taken for an erase stuck bit is taken in step 1012. Examples of such an action are to increase a fail bit count for this group of memory cells and erase again, and increase a fail bit count for this and other groups of memory cells. Further details are discussed below.

In the event that the count is equal to or greater than N2, this may indicate a problem with a word line associated with the group of memory cells. As one example, the condition depicted in FIG. 1C may have been detected. Note that in the situation in FIG. 1C, there are more fail bits than can be corrected by ECC, in one embodiment. Step 1014 is performed in response to the count being greater than N2. In step 1014, a remedial action for a potential word line fail is taken. Note that performing step 1014 does not mean that a word line has necessarily failed, but that is one possibility.

In the event that the count is less than or equal to N1, this may indicate a more general erase fail. As one example, this may be a variation of the case in FIG. 1A in which the number of fail bits between VeV and Vstuck is greater than an allowed number of fail bits, but that there are no or relatively few fail bits above Vstuck. For example, the number of fail bits above Vstuck may be less than or equal to N1. This indicates that this erase fail is not due to erase stuck bits. Step 1016 is performed in response to the count being less than or equal to N1. In step 1016, a remedial action for a general erase fail taken. One possibility is to retire the group of memory cells.

Figure 11:
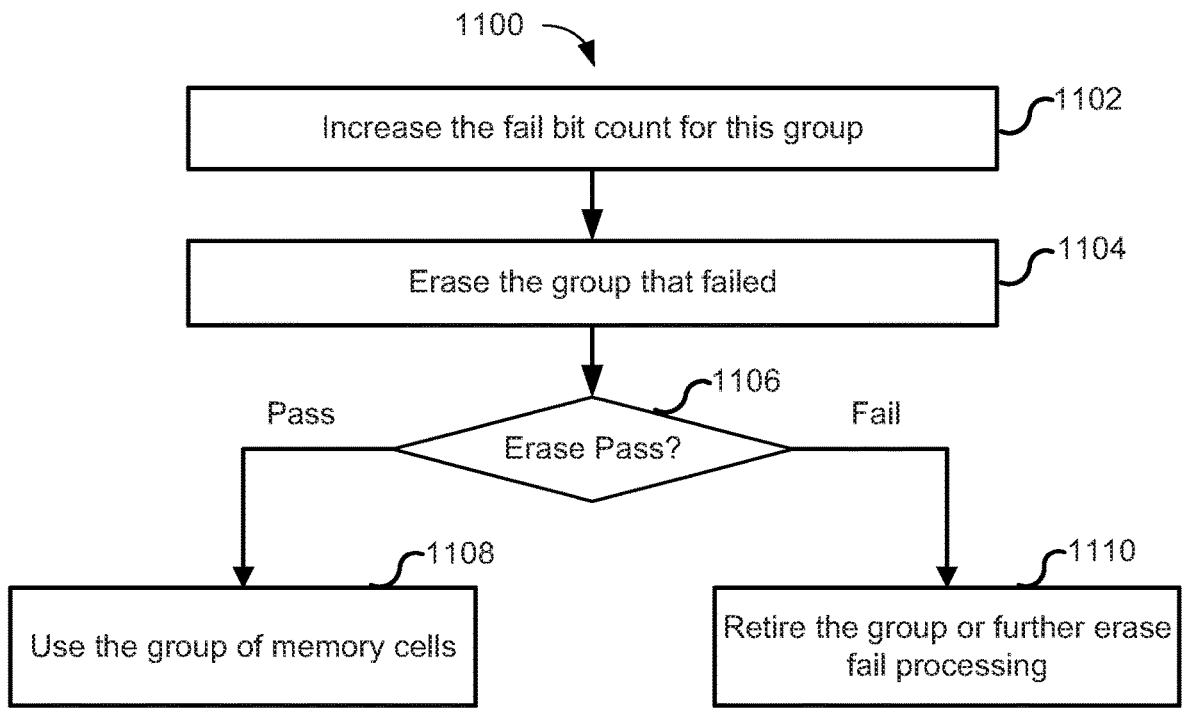
FIG. 11 is a flowchart of one embodiment of a process of an action taken in response to determining that there is an erase stuck bit condition.

FIG. 11 is a flowchart of one embodiment of a process 1100 of an action taken in response to determining that there is an erase stuck bit condition. Process 1100 involves the processing of the group of memory cells that were the subject of process 1000. Process 1100 is one embodiment of step 1012. The process 1100 is performed by a combination of one or more of controller 122, control circuitry 110, read/write circuits 128, and/or decoders 124/132, in one embodiment. The process 1100 is performed by erase circuit 902, count circuit 904 and erase result response circuit 910, in one embodiment.

In step 1102, the fail bit count for this group of memory cells is increased. By this it is meant that the fail bit count is increased from the fail bit count used in step 1002. The amount by which the fail bit count is increased depends on the count in step 1008, in one embodiment. As one example, the fail bit count was 8 bits/2 KB in step 1002. The count in step 1008 was 10 bits/2 KB, for example. The increased fail bit count is made at least as large as the count, in one embodiment. As one example, the new fail bit count may be set to 10 bits/2 KB. A small buffer may also be added. As one example, the new fail bit count may be set to 12 bits/2 KB. Step 1102 is one embodiment of step 1012.

In step 1104, the group is erased again with the new fail bit count. In one embodiment, process 10 is performed again on the group. However, a fail bit count in step 22 is set to the increased fail bit count.

Step 1106 is a conditional based on whether erase passed. If erase passed, then the group of memory cells continues to be used, in step 1108. For example, the group may be placed into a pool of blocks that are available for writing.

If erase failed, then the group of memory cells might be retired or further erase fail processing may be performed, in step 1110. Retiring the group means that the group is no longer used to store data. However, it still may be possible to use the block with further erase fail processing.

Figure 12:
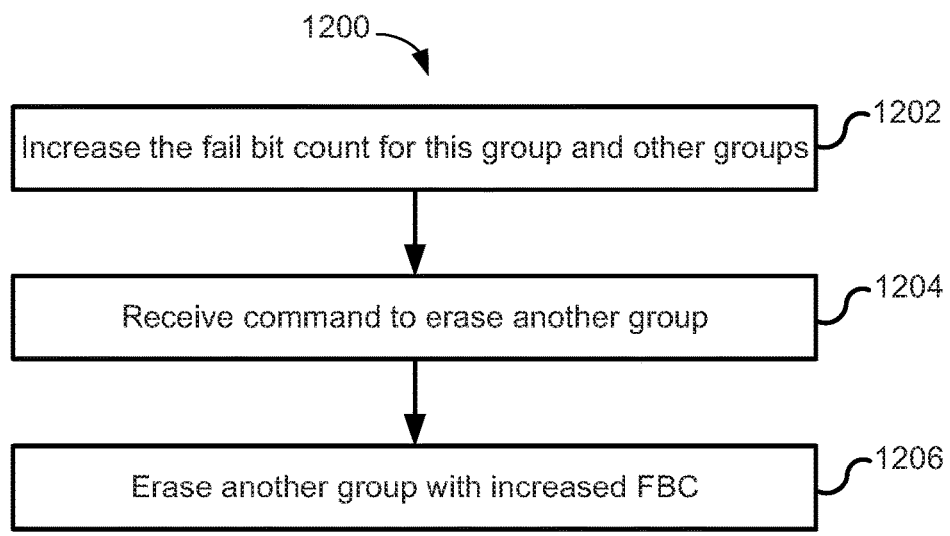
FIG. 12 is a flowchart of one embodiment of a process of an action taken in response to determining that there is an erase stuck bit condition.

FIG. 12 is a flowchart of one embodiment of a process 1200 of an action taken in response to determining that there is an erase stuck bit condition. Process 1200 is one embodiment of step 1012. The process 1200 is performed by a combination of one or more of controller 122, control circuitry 110, read/write circuits 128, and/or decoders 124/132, in one embodiment. The process 1200 is performed by erase circuit 902, count circuit 904 and erase result response circuit 910, in one embodiment.

In step 1202, the fail bit count for this group and other groups of memory cells is increased. By this it is meant that the fail bit count is increased from the fail bit count used in step 1002. Thus, note that this new fail bit count is to be used the next time this group or the other groups are erased. In one embodiment, the new fail bit count applies to all groups of memory cells on the same plane of a memory die. In one embodiment, the new fail bit count applies to all groups of memory cells on the same memory die 108. In one embodiment, the new fail bit count applies to all groups of memory cells on the memory device 100. The selection of groups of memory cells depends on which other groups may be expected to also suffer from an erase stuck bit condition. Step 1202 is one embodiment of step 1012.

The amount by which the fail bit count is increased depends on the count in step 1008, in one embodiment. As one example, the fail bit count was 8 bits/2 KB in step 1002. The 2K refers to 2048 NAND strings, in one embodiment. The count in step 1008 was 10 bits/2 KB, for example. The increased fail bit count is made at least as large as the count, in one embodiment. As one example, the new fail bit count may be set to 10 bits/2 KB. A small buffer may also be added. As one example, the new fail bit count may be set to 12 bits/2 KB.

In step 1204, a command is received to erase another group of memory cells. This command may be sent from the controller 122 to a memory die 108. For the sake of discussion, it will be assumed that this group is not the group for which the erase stuck bit condition was found in process 1000. However, it will be noted that the new fail bit count may also be applied to group for which the erase stuck bit condition was found in process 1000.

In step 1206, the group of memory cells specified in the erase command is erased with the new fail bit count. In one embodiment, process 10 is performed again on this group. However, a fail bit count in step 22 is set to the increased fail bit count. The erase process of step 1206 may pass or fail. The decision on how to handle a failed erase can vary. One possibility is to perform process 1000 on this group.

Figure 13A:
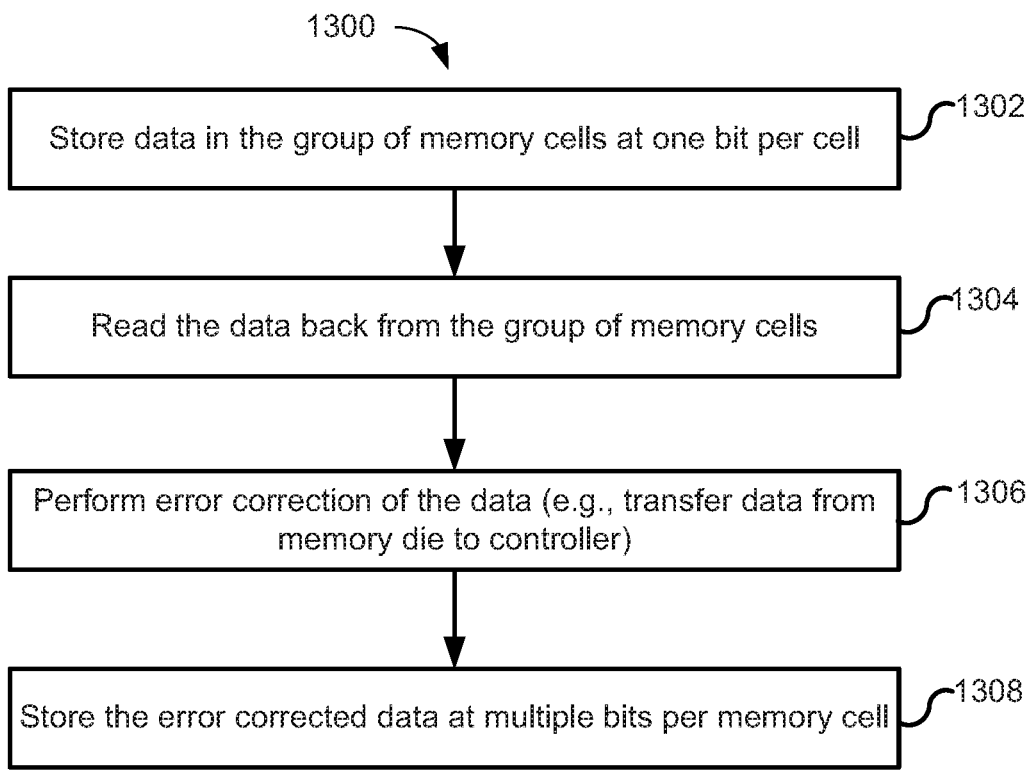
FIG. 13A is a flowchart of one embodiment of a process of performing a data folding operation when an erase stuck condition was detected in a group of memory cells.

FIG. 13A is a flowchart of one embodiment of a process 1300 of performing a data folding operation. Process 1300 is one embodiment of folding when an erase stuck condition was detected in a group of memory cells. The process 1300 is performed by a combination of one or more of controller 122, control circuitry 110, read/write circuits 128, and/or decoders 124/132, in one embodiment. The process 1300 is performed by erase circuit 902, count circuit 904 and erase result response circuit 910, in one embodiment.

Step 1302 includes storing data in the group of memory cells at one bit per memory cell. The process of FIG. 7B may be used to store the data. Step 1302 may result in distributions such as in FIG. 6C. Note that if there is an erase stuck condition, then there could be a memory cell having a threshold voltage above rV1 in FIG. 6A. If such memory cell was supposed to be in the "1" state in FIG. 6C, such a memory cell would be mis-programmed.

Step 1304 includes reading the data back that was stored in the group of memory cells. The data may be read back using the read reference level of rV1. As noted above, a memory cell that is an erase stuck bit could be read as being in the "0" state, although it was intended to be in the "1" state.

Step 1306 includes performing error correction of the data. In one embodiment, the data needs to be transferred off from the memory die 108 to the memory controller 122 to perform the error correction. This is because the memory die 108 might not have the capability to perform error correction. Even if the memory die 108 does have the capability to perform error correction, such as step consumes additional time. Note that the number N2 in process 1000 is kept sufficiently low such that all errors due to erase stuck bits can be corrected by the error correction algorithm, in one embodiment.

Step 1308 includes storing the error corrected data at multiple bits per memory cell. Note that data from this group may be combined with data from another group. For example, the data from three blocks of memory cells that store 1-bit per cell may be folding into a single block of memory cells that stores three bits per memory cell. Thus, further note that the data can be stored in a different group of memory cells than the group the data was just read from in step 1302.

The process of FIG. 7B may be used to store the data at multiple bits per memory cell. Step 1308 may result in distributions such as in FIG. 5, in the event three bits are stored per memory cell. Step 1308 may result in distributions such as in FIG. 8A, in the event two bits are stored per memory cell. Many different algorithms are possible for storing multiple bits per memory cell. For example, the two pass technique of FIGS. 8B-8C may be used, the two pass technique of FIGS. 8D-8E may be used, etc.

Note that if the errors due to the erase stuck condition were not corrected, such errors could be propagated in step 1308. Hence, such propagation errors are reduced or eliminated. However, this may come at the expense of additional processing time to transfer the data off from the memory die 108 to the controller 122 for error correction.

Figure 13B:
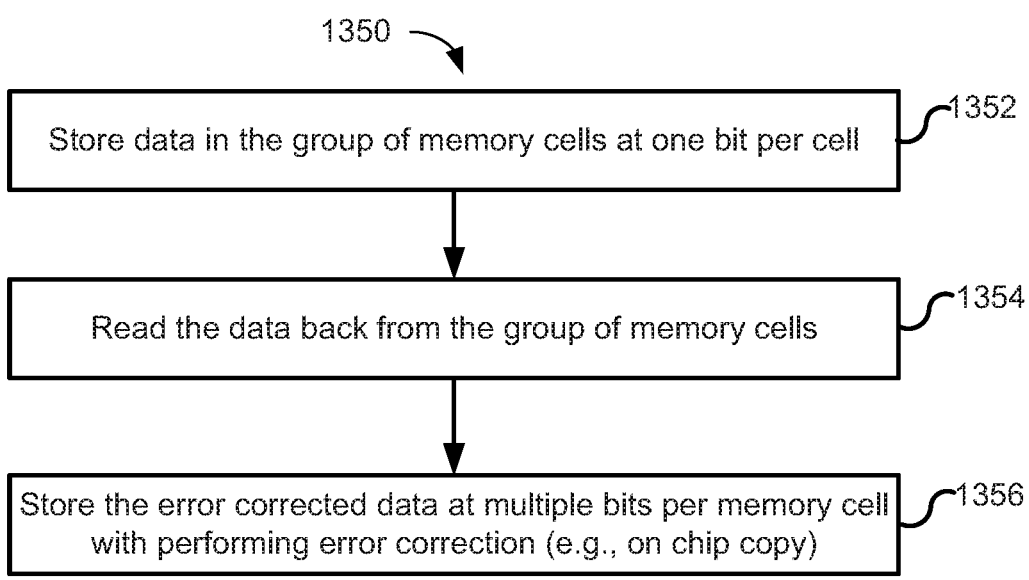
FIG. 13B is a flowchart of one embodiment of a process of performing a data folding operation when an erase stuck condition is not detected in a group of memory cells.

FIG. 13B is a flowchart of one embodiment of a process 1350 of performing a data folding operation. Process 1350 is one embodiment of folding when an erase stuck condition is not detected in a group of memory cells. Thus, process 1350 might be performed when step 1004 of process 1000 indicated erase passed. The process 1350 is performed by a combination of one or more of controller 122, control circuitry 110, read/write circuits 128, and/or decoders 124/132, in one embodiment. The process 1350 is performed by erase circuit 902, count circuit 904 and erase result response circuit 910, in one embodiment.

Step 1352 includes storing data in the group of memory cells at one bit per memory cell. The process of FIG. 7B may be used to store the data. Step 1352 may result in distributions such as in FIG. 6C.

Step 1354 includes reading the data back that was stored in the group of memory cells. The data may be read back using the read reference level of rV1. As noted above, a memory cell that is an erase stuck bit could be read as being in the "0" state, although it was intended to be in the "1" state.

Step 1356 includes storing the error corrected data at multiple bits per memory cell without performing error correction of the data. In one embodiment an "on-chip" copy is performed. The data does not leave the memory die 108 in an on-chip copy. As with process 1300, the data from this group may be combined with data from another group. The data may be stored at two-bit per cell, three-bits per cell, etc. As with process 1300, many different algorithms are possible for storing multiple bits per memory cell. Note that the risk of propagating errors in step 1356 may be much lower than when there are erase stuck bits, as was the case in process 1300. Hence, data can be folded without a time consuming transfer off chip and/or without time consuming ECC, without a significant risk of propagating errors.

A first embodiment disclosed herein includes an apparatus, comprising a group of non-volatile memory cells, an erase circuit configured to perform an erase operation on the group, and a counting circuit configured to determine whether a first fail bit count for the group with respect to a first erase verify level for the erase operation exceeds an allowed fail bit count. The counting circuit is further configured to determine a second fail bit count for the group with respect to a second erase verify level that is less stringent than the first erase verify level responsive to the first fail bit count being above the allowed fail bit count. The apparatus further comprises a response circuit configured to increase the allowed fail bit count for the first erase verify level to at least the second fail bit count responsive to the second fail bit count being between a first number and a second number.

In a second embodiment, in accordance with the first embodiment, the erase circuit is further configured to erase other groups of non-volatile memory cells in the apparatus using the increased allowed fail bit count.

In a third embodiment, in accordance with the first or second embodiments, the first number is equal to the allowed fail bit count for which the group failed erase with respect to the first erase verify level.

In a fourth embodiment, in accordance with any of the first to third embodiments, the second number is equal to a maximum number of bits that could be corrected using an error correction code (ECC) algorithm to correct errors in data read from the group of memory cells.

In a fifth embodiment, in accordance with the fourth embodiment the response circuit is further configured to perform a remedial action for a word line fail in the group of memory cells responsive to the second fail bit count being equal to or greater than the second number without increasing the allowed fail bit count.

In a sixth embodiment, in accordance with any of the first to fifth embodiments the response circuit is further configure to instruct the erase circuit to perform the erase operation on the group again using the increased allowed fail bit count responsive to the second fail bit count being between the first number and the second number.

A seventh embodiment, in accordance with any of the first to sixth embodiments further comprises a programming circuit configured to: store first data in the group at a single bit per memory cell after the group have been erased with erase passing with respect to the first erase verify level; read the first data stored in the group; store the first data that was read from group at multiple bits per non-volatile memory cell without error correction of the first data; store second data in the group at a single bit per memory cell responsive to the second fail bit count being between the first number and the second number after erase fails with respect to the first erase verify level; read the second data stored in the group; perform error correction on the second data read from the group; and store the error corrected second data at multiple bits per non-volatile memory cell.

In an eighth embodiment, in accordance with any of the first to seventh embodiments the second erase verify level is above an expected upper tail of an erase distribution that passes the erase operation with respect to the first erase verify level.

In a ninth embodiment, in accordance with any of the first to eighth embodiments, the group of non-volatile memory cells are part of a plurality of NAND strings in a three-dimensional memory structure. The second fail bit count represents a number of NAND strings that failed erase with respect to the second erase verify level.

In a tenth embodiment, in accordance with the ninth embodiment, the response circuit is further configured to detect an erase stuck bit condition in the group responsive to the second fail bit count being between the first number and the second number. The erase stuck bit condition is indicative of the group having between the first number and the second number of NAND strings with at least one memory cell whose threshold voltage cannot be reduced below the first erase verify level using the erase operation.

One embodiment includes a method comprising: performing an erase operation on a group of NAND strings of non-volatile memory cells; determining whether more than an allowed number of NAND strings in the group failed to erase with respect to a first erase verify reference voltage; determining a count of NAND strings in the group that failed to erase with respect to a second erase verify reference voltage that is greater than the first erase verify reference voltage responsive to more than the allowed number of NAND strings having failed to erase with respect to the first erase verify reference voltage; and increasing a number of NAND strings that are allowed to have at least one memory cell with a threshold voltage above the first erase verify reference voltage to at least the count responsive to determining the count is between a first number and a second number.

One embodiment disclosed herein includes a non-volatile storage device, comprising: a group of NAND strings of non-volatile memory cells; erase means for performing an erase operation on the group of NAND strings; and counting means for determining whether more than an allowed number of NAND strings in the group have at least one memory cell with a threshold voltage greater than a first erase verify reference voltage after the erase operation. The counting means is further for determining a count of NAND strings in the group that have at least one memory cell with a threshold voltage greater than a second erase verify reference voltage that is greater than the first erase verify reference voltage responsive to more than the allowed number of NAND strings in the group having at least one memory cell having a threshold voltage greater than the first erase verify reference voltage after the erase operation. The apparatus further comprises response means for increasing the number of NAND strings that are allowed to have at least one memory cell having a threshold voltage above the first erase verify reference voltage and still pass the erase operation to at least the count responsive to determining the count is between a first number and a second number.

Herein, erase means includes one or more of controller 122, control circuitry 110, read/write circuits 128, decoders 124/132, erase circuit 902, an application specific integrated circuit (ASIC), a Field Programmable Gate Array (FPGA), a circuit, a digital logic circuit, an analog circuit, a combination of discrete circuits, gates, or any other type of hardware or combination thereof. The erase means may comprise other hardware and/or software.

Herein, counting means includes one or more of controller 122, control circuitry 110, read/write circuits 128, decoders 124/132, count circuit 904, an application specific integrated circuit (ASIC), a Field Programmable Gate Array (FPGA), a circuit, a digital logic circuit, an analog circuit, a combination of discrete circuits, gates, or any other type of hardware or combination thereof. The erase means may comprise other hardware and/or software.

Herein, response means includes one or more of controller 122, control circuitry 110, read/write circuits 128, decoders 124/132, erase result response circuit 910, an application specific integrated circuit (ASIC), a Field Programmable Gate Array (FPGA), a circuit, a digital logic circuit, an analog circuit, a combination of discrete circuits, gates, or any other type of hardware or combination thereof. The erase means may comprise other hardware and/or software.

For purposes of this document, a block is a physical grouping of memory cells. In one example, a block is a unit of erase. However, in other examples a block need not be a unit of erase. In one example, a block comprises a set of memory cells connected by uninterrupted word lines such as a set of NAND strings connected to a common set of word lines. Other physical arrangement can also be used.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
   a group of non-volatile memory cells;
   an erase circuit configured to perform an erase operation on the group;
   a counting circuit configured to determine whether a first fail bit count for the group with respect to a first erase verify level for the erase operation exceeds an allowed fail bit count;
   the counting circuit further configured to determine a second fail bit count for the group with respect to a second erase verify level that is a higher magnitude reference voltage than the first erase verify level responsive to the first fail bit count being above the allowed fail bit count; and
   a response circuit configured to increase the allowed fail bit count for the erase verify level to at least the second fail bit count responsive to the second fail bit count being between a first number and a second number.

2. The apparatus of claim 1, wherein:
   the erase circuit is further configured to erase other groups of non-volatile memory cells in the apparatus using the increased allowed fail bit count.

3. The apparatus of claim 1, wherein the first number is equal to the allowed fail bit count for which the group failed erase with respect to the first erase verify level.

4. The apparatus of claim 3, wherein the second number is equal to a maximum number of bits that could be corrected using an error correction code (ECC) algorithm to correct errors in data read from the group of memory cells.

5. The apparatus of claim 4, wherein the response circuit is further configured to:
   perform a remedial action for a word line fail in the group of memory cells responsive to the second fail bit count being equal to or greater than the second number without increasing the allowed fail bit count.

6. The apparatus of claim 1, wherein the response circuit is further configured to: instruct the erase circuit to perform the erase operation on the group again using the increased allowed fail bit count responsive to the second fail bit count being between the first number and the second number.

7. The apparatus of claim 1, further comprising:
   a programming circuit configured to:
   store first data in the group at a single bit per memory cell after the group have been erased with erase passing with respect to the first erase verify level;
   read the first data stored in the group;
   store the first data that was read from group at multiple bits per non-volatile memory cell without error correction of the first data;
   store second data in the group at a single bit per memory cell responsive to the second fail bit count being between the first number and the second number after erase fails with respect to the first erase verify level;

read the second data stored in the group;

perform error correction on the second data read from the group; and store the error corrected second data at multiple bits per non-volatile memory cell.

8. The apparatus of claim 1, wherein the second erase verify level is above an expected upper tail of an erase distribution that passes the erase operation with respect to the first erase verify level.

9. The apparatus of claim 1, wherein the group of non-volatile memory cells are part of a plurality of NAND strings in a three-dimensional memory structure, wherein the second fail bit count represents a number of NAND strings that failed erase with respect to the second erase verify level.

10. The apparatus of claim 9, wherein the response circuit is further configured to detect an erase stuck bit condition in the group responsive to the second fail bit count being between the first number and the second number, wherein the erase stuck bit condition is indicative of the group having between the first number and the second number of NAND strings with at least one memory cell whose threshold voltage cannot be reduced below the first erase verify level using the erase operation.

11. A method comprising:

performing an erase operation on a group of NAND strings of non-volatile memory cells;

determining whether more than an allowed number of NAND strings in the group failed to erase with respect to a first erase verify reference voltage;

determining a count of NAND strings in the group that failed to erase with respect to a second erase verify reference voltage that is greater than the first erase verify reference voltage responsive to more than the allowed number of NAND strings having failed to erase with respect to the first erase verify reference voltage; and increasing a number of NAND strings that are allowed to have at least one memory cell with a threshold voltage above the first erase verify reference voltage to at least the count responsive to determining the count is between a first number and a second number.

12. The method of claim 11, further comprising:

erasing a different group of NAND strings using the increased number of NAND strings that are allowed to have at least one memory cell with a threshold voltage above the first erase verify reference voltage.

13. The method of claim 11, wherein the first number is equal to the number of NAND strings that are allowed to have at least one memory cell with a threshold voltage above the first erase verify reference voltage and pass the erase operation.

14. The method of claim 13, wherein the second number is equal to a maximum number of bits that could be corrected using an error correction code (ECC) algorithm to correct errors in data read from one memory cell on each of the NAND strings in the group.

15. The method of claim 11, further comprising:

storing data in the group of NAND strings at a single bit per memory cell responsive to the count being between the first number and the second number;

reading the data that was stored in the group;

performing error correction on the data read from the group; and storing the error corrected data at multiple bits per non-volatile memory cell.

16. The method of claim 15, wherein the erase operation is a first erase operation, and further comprising:

performing a second erase operation on the group of NAND strings;

determining whether more than the allowed number of NAND strings in the group have at least one memory cell with a threshold voltage greater than the first erase verify reference voltage after the second erase operation;

storing second data in the group at a single bit per memory cell responsive to less than the allowed number of NAND strings in the group having at least one memory cell with a threshold voltage greater than the first erase verify reference voltage after the second erase operation;

reading the second data from the group; and storing the second data at multiple bits per non-volatile memory cell without performing error correction on the second data.

17. The method of claim 11, wherein the first erase verify level is below an expected upper tail of an erase distribution and the second erase verify level is above the expected upper tail of the erase distribution.

18. A non-volatile storage device, comprising:

a group of NAND strings of non-volatile memory cells;

erase means for performing an erase operation on the group of NAND strings;

counting means for determining whether more than an allowed number of NAND strings in the group have at least one memory cell with a threshold voltage greater than a first erase verify reference voltage after the erase operation;

the counting means further for determining a count of NAND strings in the group that have at least one memory cell with a threshold voltage greater than a second erase verify reference voltage that is greater than the first erase verify reference voltage responsive to more than the allowed number of NAND strings in the group having at least one memory cell having a threshold voltage greater than the first erase verify reference voltage after the erase operation; and response means for increasing the number of NAND strings that are allowed to have at least one memory cell having a threshold voltage above the first erase verify reference voltage and still pass the erase operation to at least the count responsive to determining the count is between a first number and a second number.

19. The non-volatile storage device of claim 18, wherein the erase means is further for:

erasing a different group of NAND strings using the increased number of NAND strings that are allowed to have at least one memory cell having a threshold voltage above the first erase verify reference voltage and still pass the erase operation.

20. The non-volatile storage device of claim 18, wherein the first number is equal to the original number of NAND strings in the group that are allowed to have at least one memory cell with a threshold voltage greater than a first erase verify reference voltage, wherein the second number is equal to a maximum number of bits that could be corrected using an error correction code (ECC) algorithm to correct errors in data read from the group of memory cells.

* * * * *